US006452986B1

(12) United States Patent
Luxford et al.

(10) Patent No.: US 6,452,986 B1
(45) Date of Patent: Sep. 17, 2002

(54) DETECTOR TOLERANT OF FREQUENCY MISALIGNMENT

(75) Inventors: Gregory Vincent Luxford, Suffolk; Clive Russell Irving, Cambridgeshire, both of (GB)

(73) Assignee: Cellnet Data Systems, Inc., San Carlos, CA (US)

( * ) Notice: Subject to any disclaimer, the term of this patent is extended or adjusted under 35 U.S.C. 154(b) by 0 days.

(21) Appl. No.: 09/313,125

(22) Filed: May 17, 1999

(51) Int. Cl.[7] .................. G08C 15/00; G08C 17/00

(52) U.S. Cl. .................. 375/343; 375/376; 375/354

(58) Field of Search .................. 375/376, 375, 375/135, 136, 142, 145, 253, 371, 316, 149, 150, 151, 260, 349, 327, 354, 343; 455/137, 139, 147, 190.1; 340/870.02, 870.03, 870.4, 855.3; 329/325; 327/145, 147, 154, 156

(56) References Cited

U.S. PATENT DOCUMENTS

| | | | |
|---|---|---|---|
| 4,477,809 A | 10/1984 | Bose | 340/825 |
| 4,904,950 A * | 2/1990 | Brown et al. | 329/341 |
| 4,977,612 A | 12/1990 | Wilson | 455/166 |
| 5,179,569 A | 1/1993 | Sawyer | 375/1 |
| 5,377,224 A | 12/1994 | Hudson | 375/1 |
| 5,537,435 A | 7/1996 | Carney et al. | 375/219 |
| 5,541,552 A * | 7/1996 | Suzuki et al. | 329/307 |
| 5,553,094 A | 9/1996 | Johnson et al. | 375/200 |
| 5,586,193 A * | 12/1996 | Ichise et al. | 381/106 |
| 5,604,768 A | 2/1997 | Fulton | 375/220 |
| 5,768,693 A | 6/1998 | Wong | 455/116 |
| 5,946,292 A * | 8/1999 | Tsujishita et al. | 370/204 |
| 6,058,162 A * | 5/2000 | Nelson et al. | 379/27 |

OTHER PUBLICATIONS

"65 MSPS Digital Receive Signal Processor," Analog Devices, downloaded from www.analog.com/pdf/preview, Apr. 28, 1999, 1 pg.
Product Page:AD6600 AD6620, downloaded from www.analog.com/products/descriptions, Apr. 28, 1999, 1 pg.
"All–Digital Wireless Basestation," Analog Devices, downloaded from www.analog.c . . . s/whitepapers/products, Sep. 1, 1998, 3 pgs.
"Universal Basestation/Wideband Receivers Background Information," Analog Devices, downloaded from www.analog.c . . . s/whitepapers/products/AD9042, Sep. 1, 1998, 3 pgs.
Hosking et al., "Digital Receivers Bring DSP to Radion Frequencies," downloaded from www.eg3.com/vtc/pent/recvr.htm, Sep. 1, 1998, 13 pgs.
Digital Communications, downloaded from www.pentek.com/tutorials/Digcom.CFM, Sep. 1, 1998, 3 pgs.
Digital Signal Processing, downloaded from www.tapr.org/dsp, Sep. 1, 1998, 5 pgs.
DSP Card 4 User's Manual—Introduction, (Apr–95), downloaded from www.tapr.org/dsp4/introduction.html, Sep. 1, 1998, 8 pgs.
DSP Card 4 User's Manual–Hardware, (Apr–95), downloaded from www.tapr.org/dsp4/hardware.html, Sep. 1, 1998, 6 pgs.

(List continued on next page.)

Primary Examiner—Chi Pham
Assistant Examiner—Dung X. Nguyen
(74) Attorney, Agent, or Firm—Fish & Richardson P.C.

(57) ABSTRACT

A method to separate data transmitted in parallel at arbitrary frequencies within a channel includes: separating a signal from one channel into a plurality of bins representing sub-channels, each bin having a bin frequency; generating a locked frequency by applying a phase locked loop (PLL) to each sub-channel; determining a difference between the locked frequency and the bin frequency; and correlating the signal with a difference between the locked frequency and the bin frequency.

9 Claims, 19 Drawing Sheets

OTHER PUBLICATIONS

DSP Card 4 User's Manual–Firmware, (Apr–95), downloaded from www.tapr.org/dsp4/firmware.html, Sep. 1, 1998, 10 pgs.

DSP Card 4 User's Manual–Application Software, (Apr–95), downloaded from www.tapr.org/dsp4/application.html, Sep. 1, 1998, 8 pgs.

Brannon et al., "A Look atSoftware Radios: Are They Fact Or Fiction?" Electronic Design, Dec. 1, 1998, 117–122.

Brannon, "Digital–radio–receiver design requires re–evaluation of parameters," EDN Nov. 5, 1998, 163–170.

Stevens, "DSPs in communications," IEEE Spectrum, Sep. 1998, 39–46.

Frerking, "Digital Signal Processing in Communication Systems," 182–184, 218–221, 249–252, 433–440.

* cited by examiner

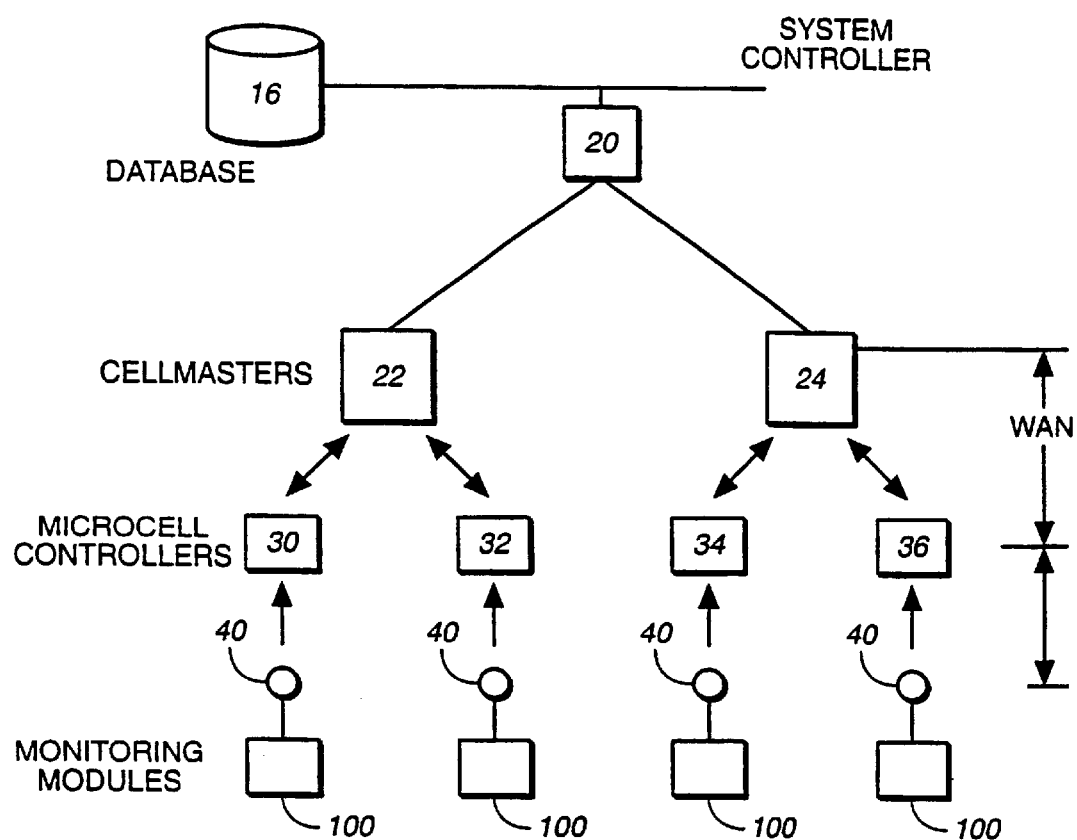
FIG._1

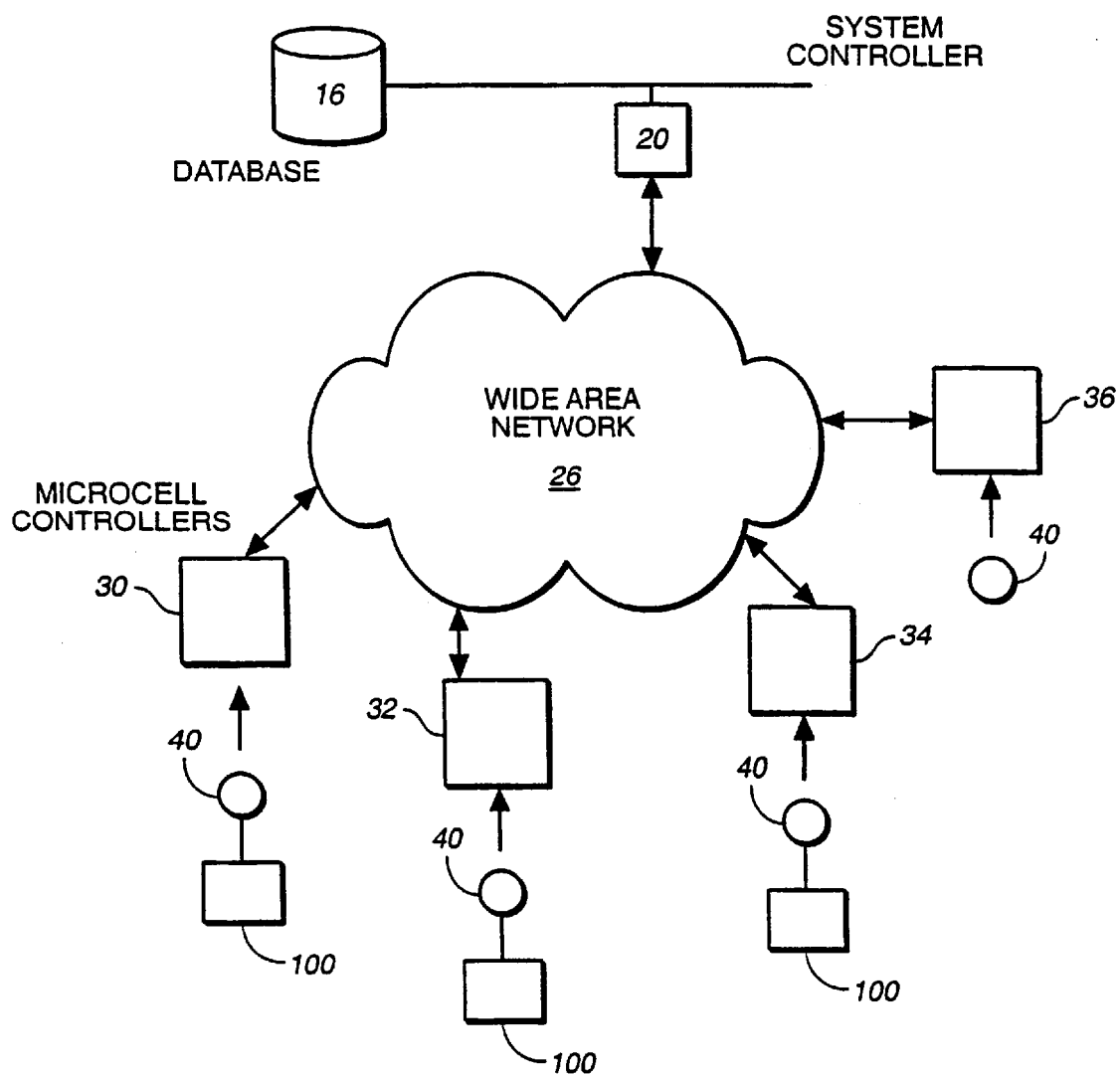
FIG._2

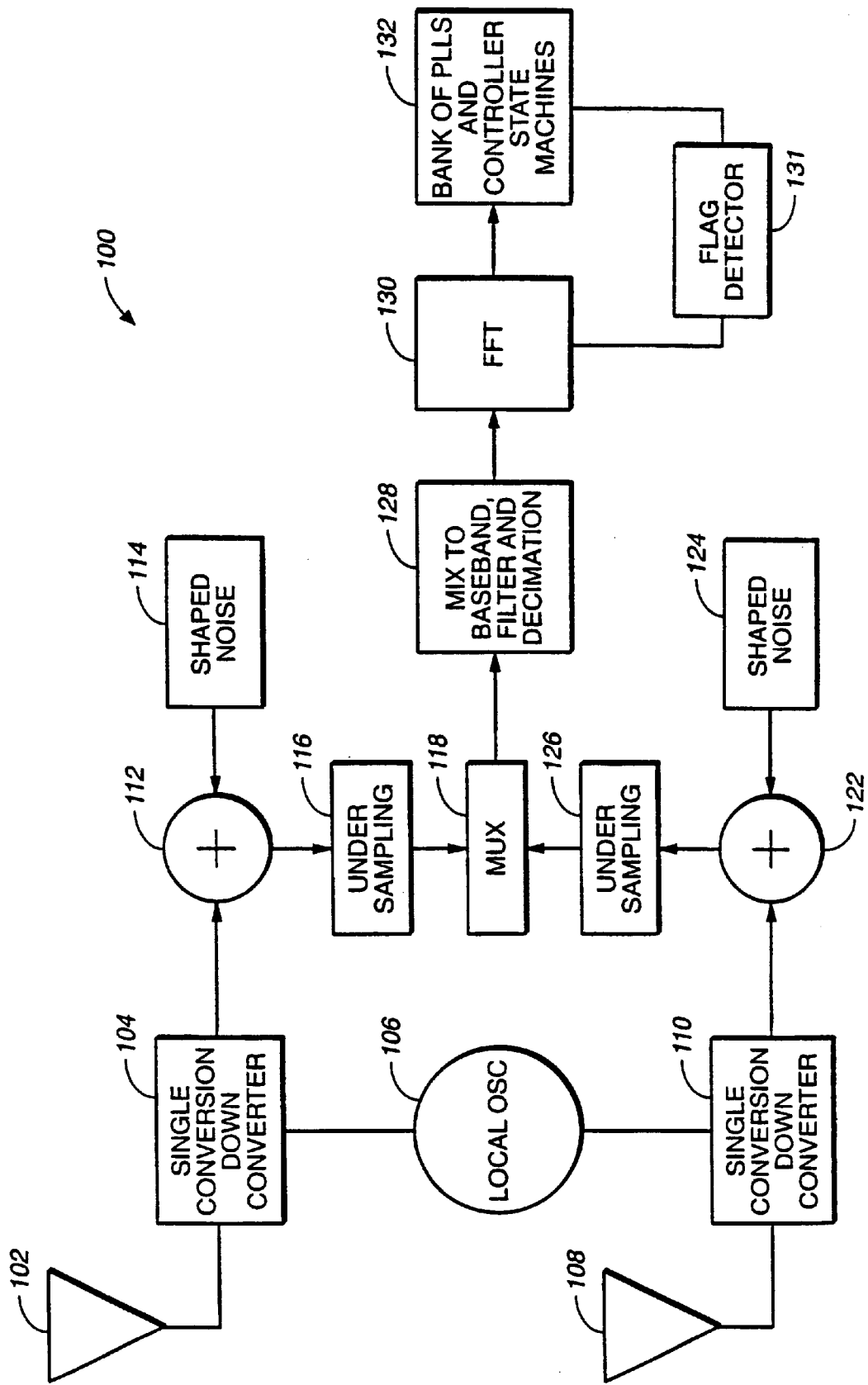
FIG._3

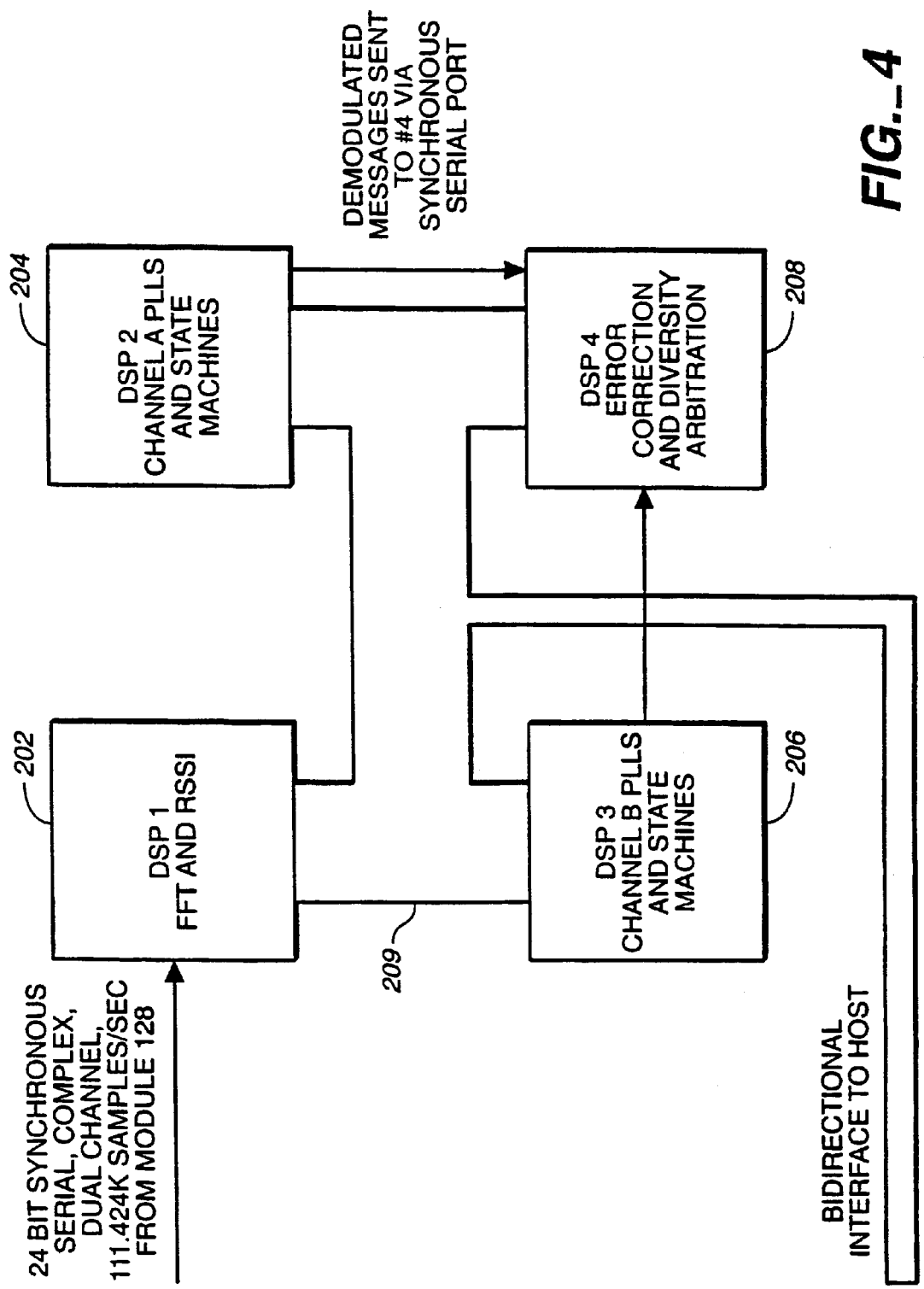
FIG._4

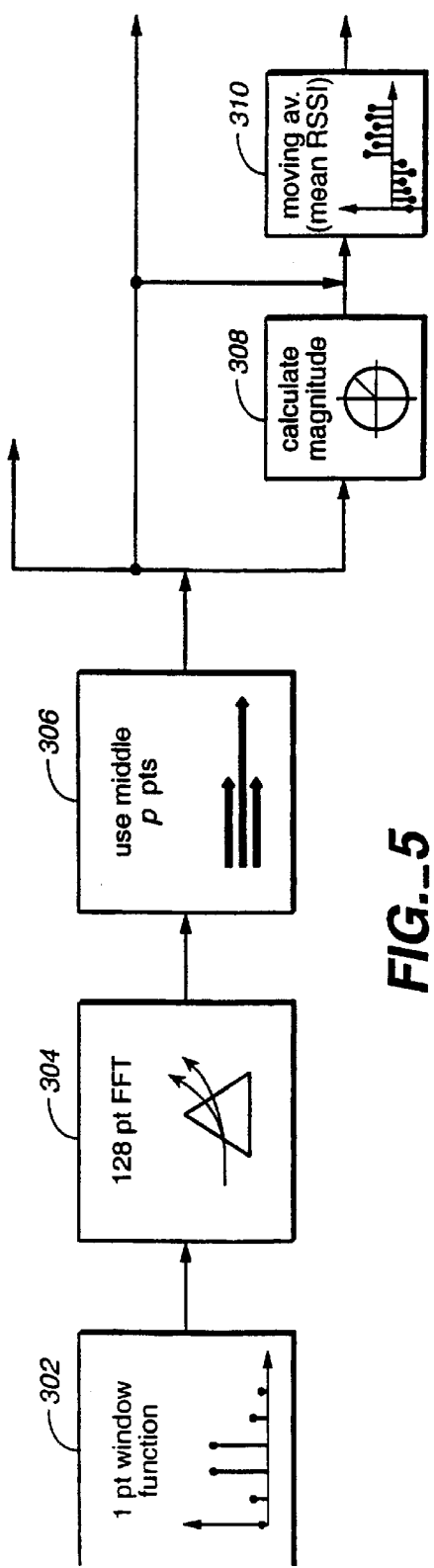
FIG._5
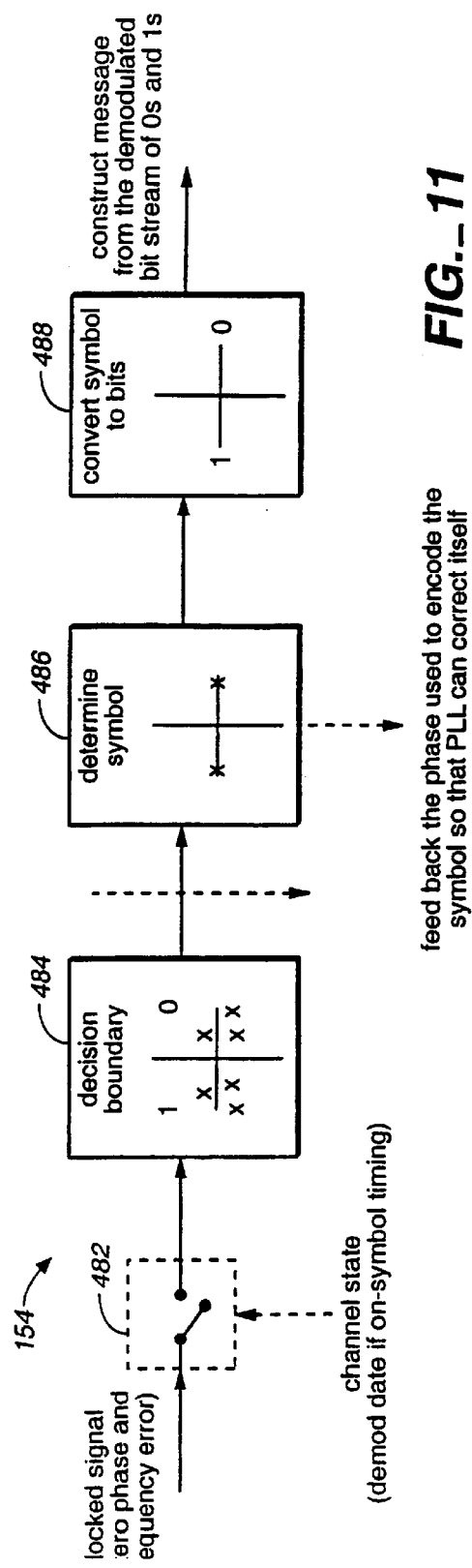
FIG._11

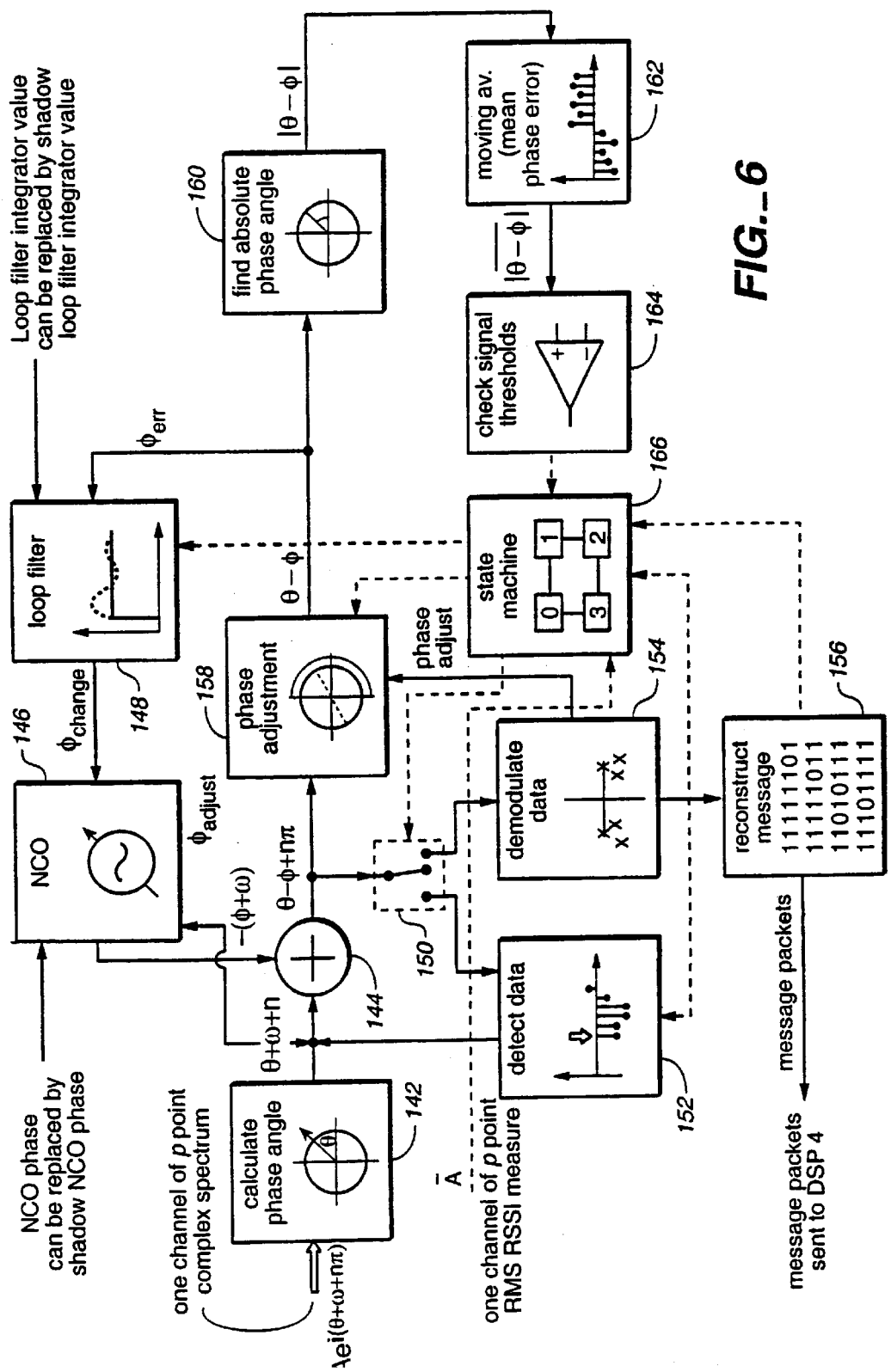
FIG._6

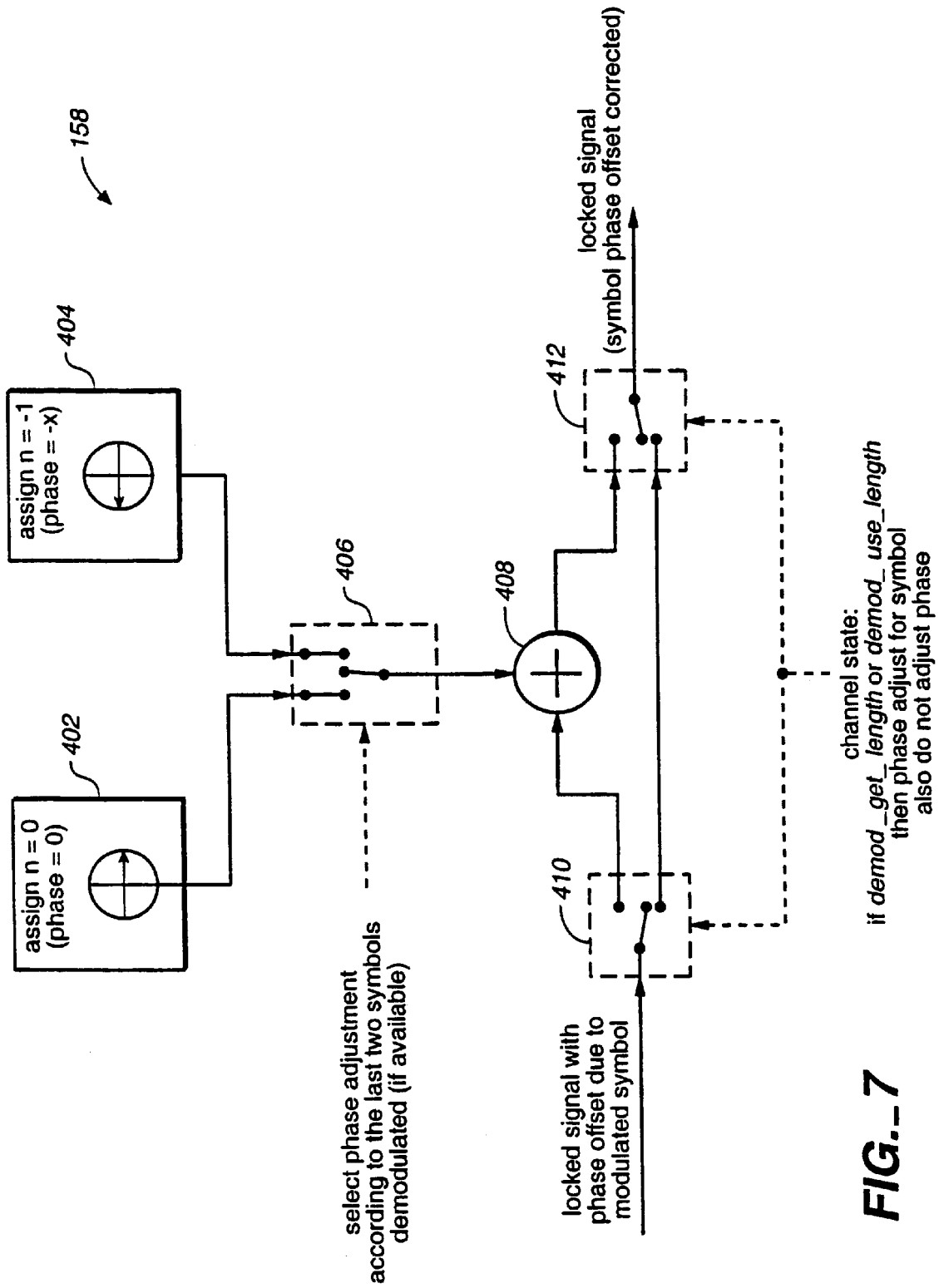
FIG._7

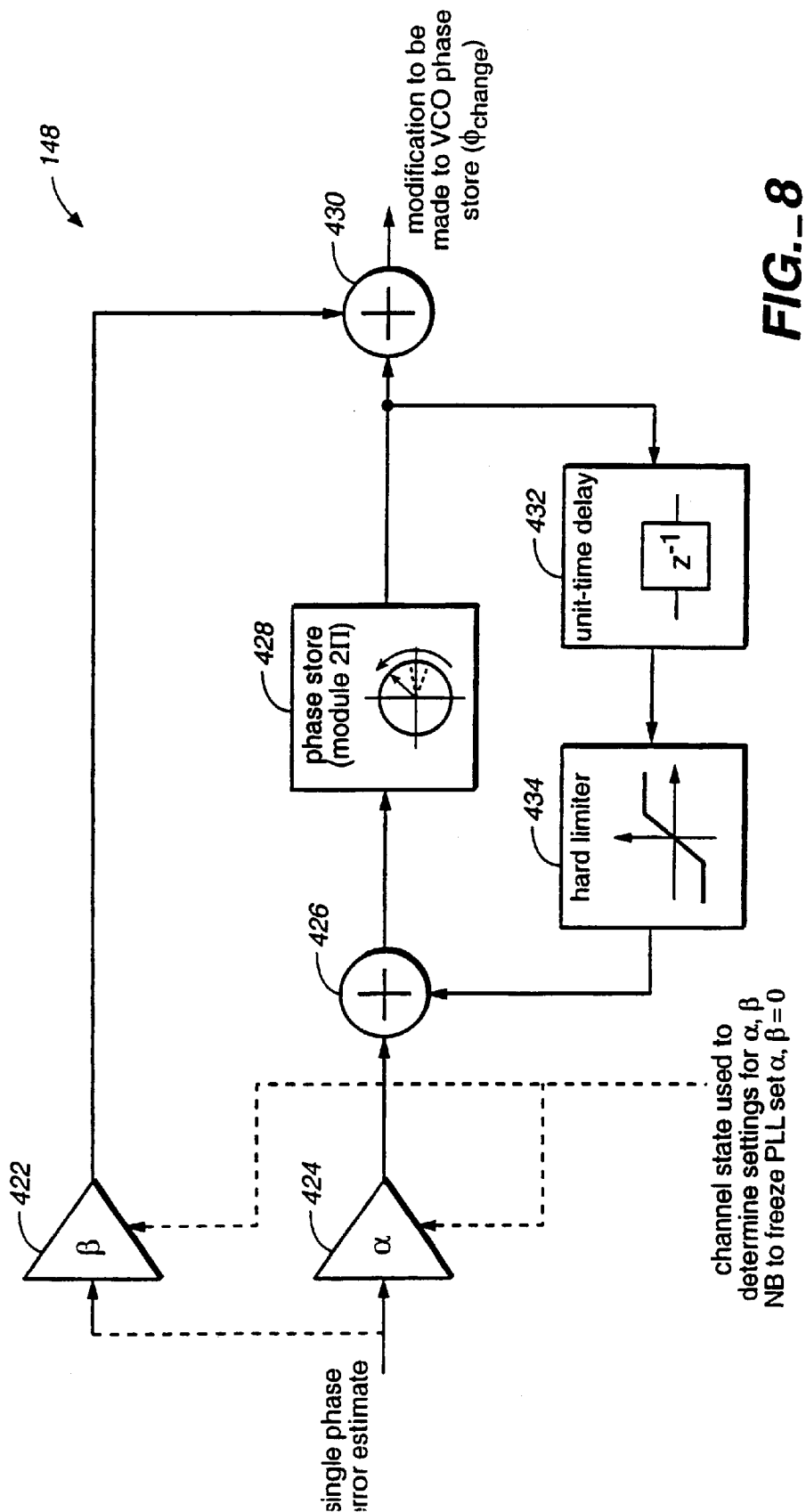
FIG._8

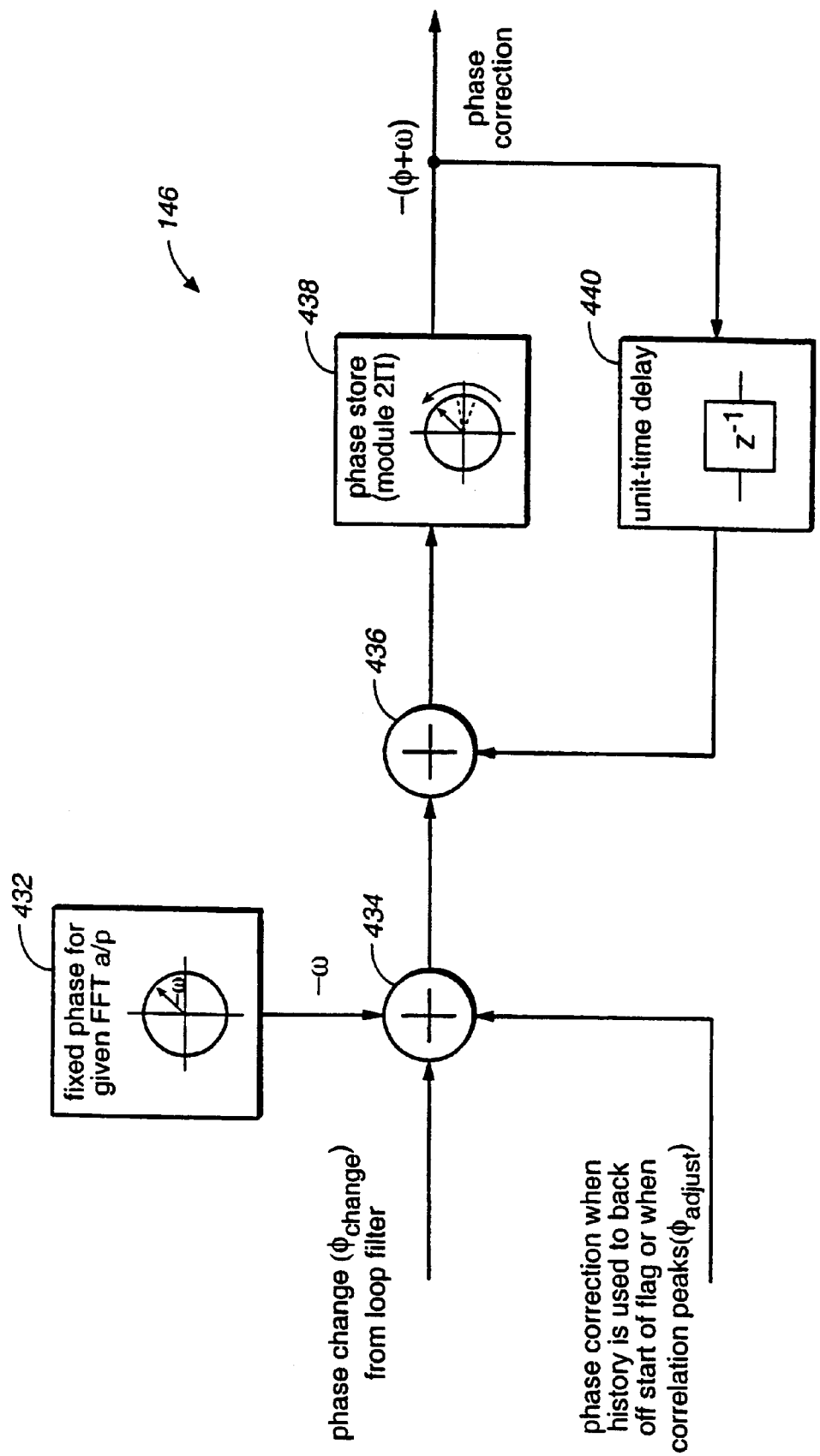

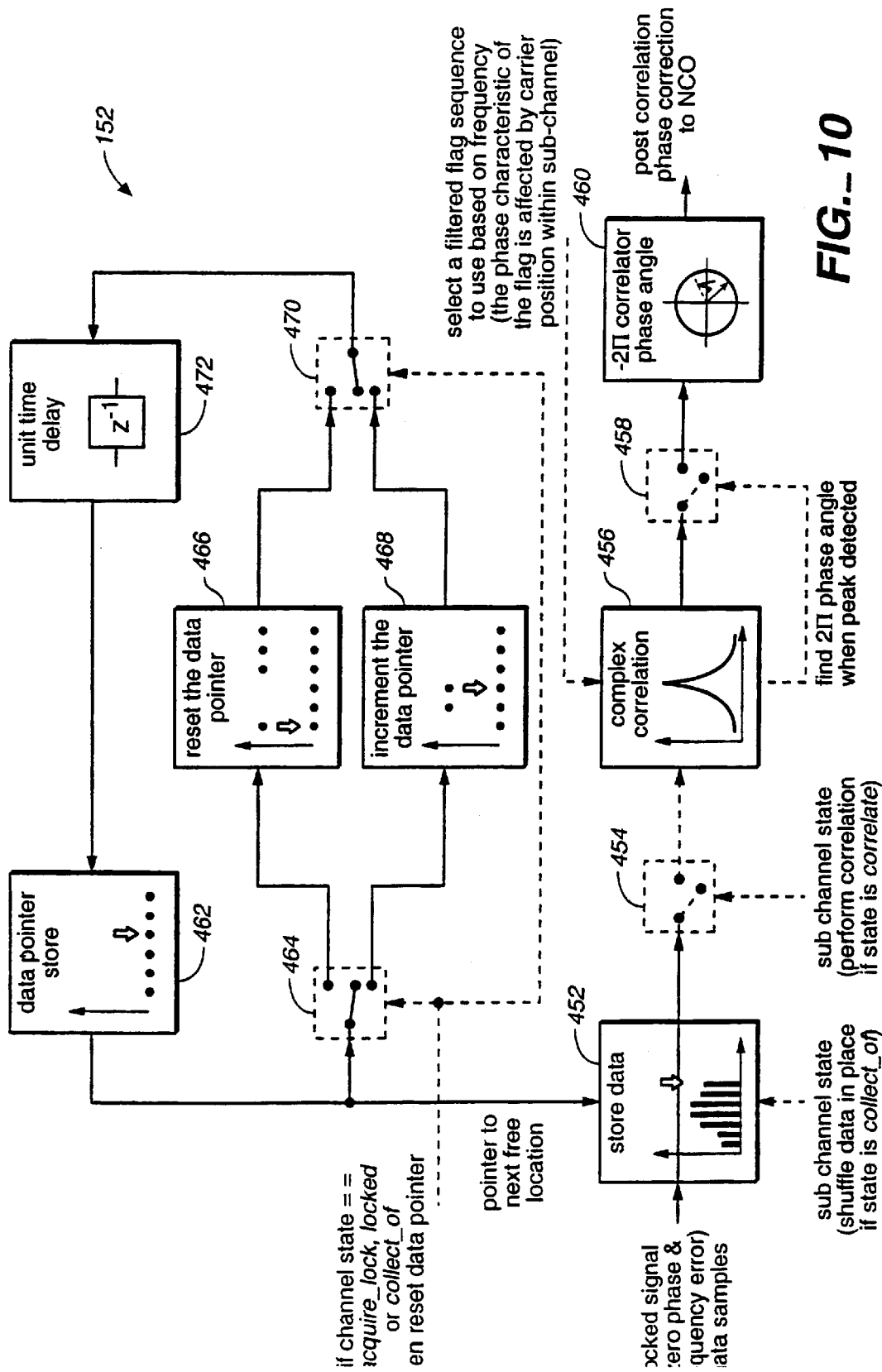
FIG._10

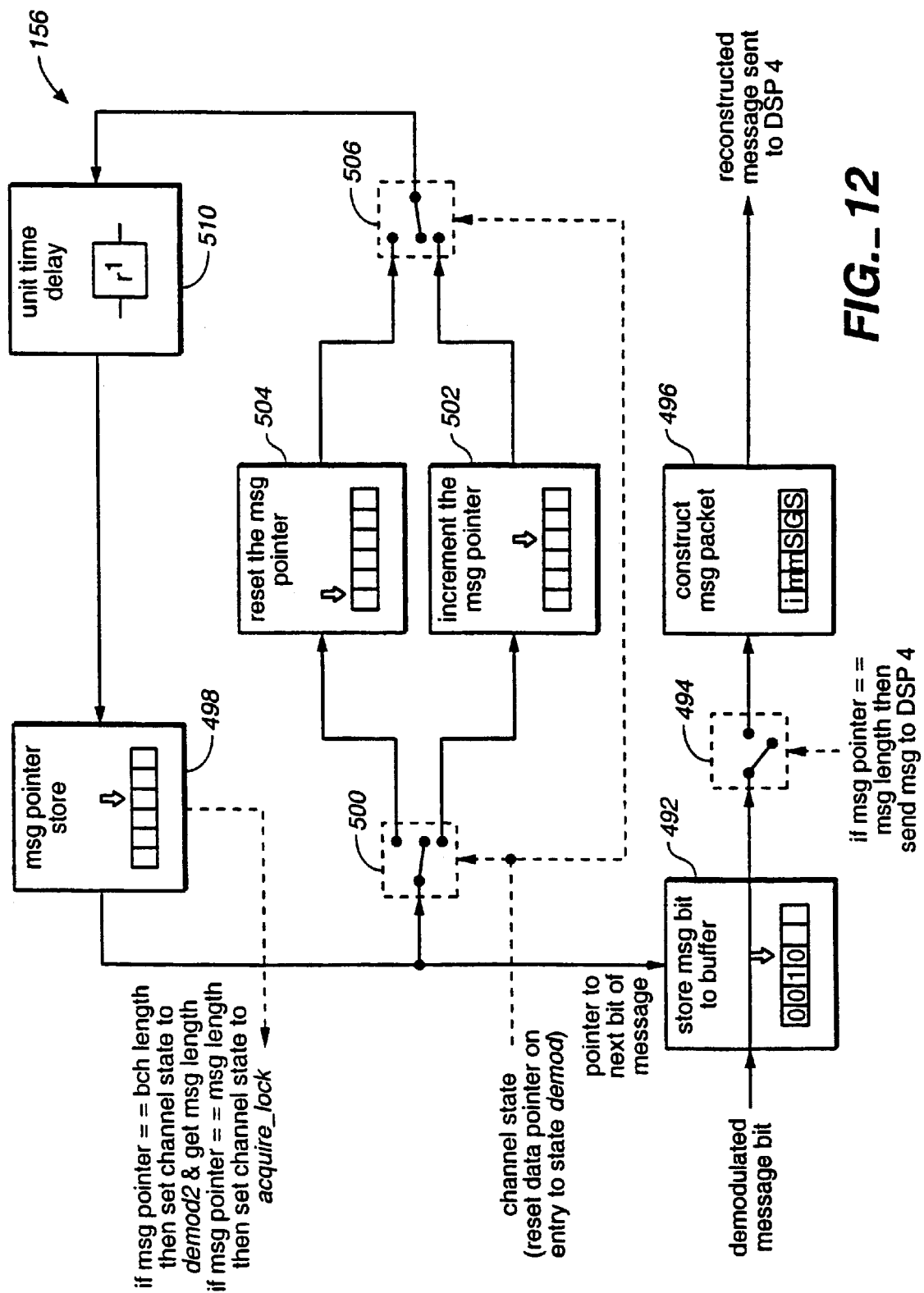
FIG._12

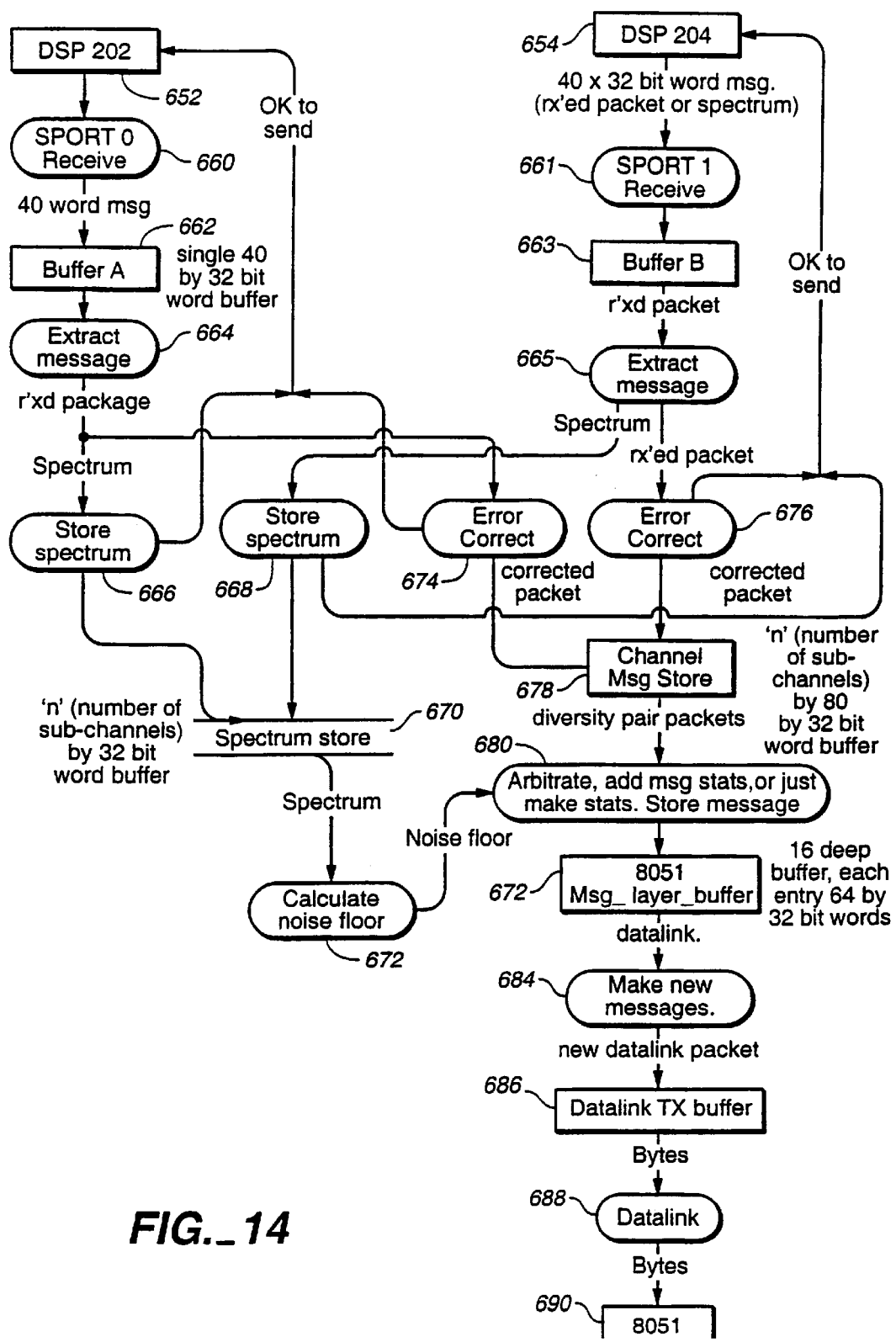
FIG._14

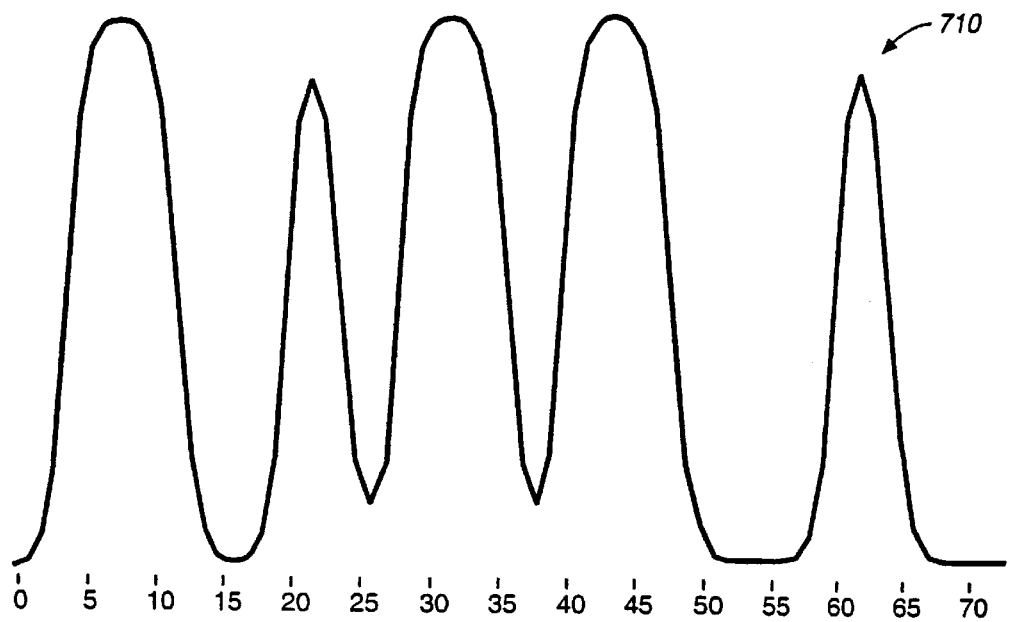
FIG._15A
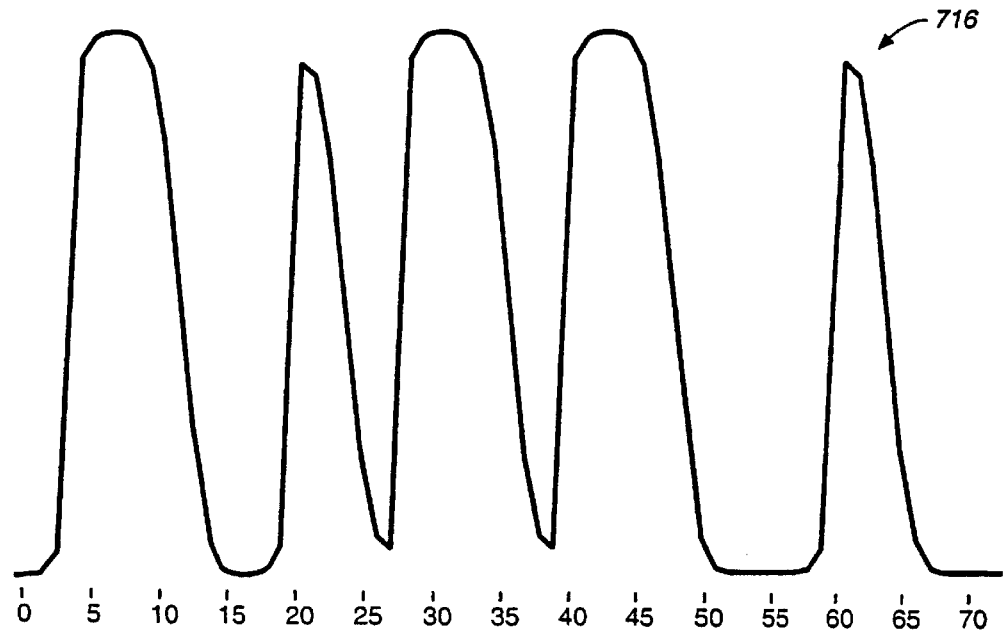
FIG._15B

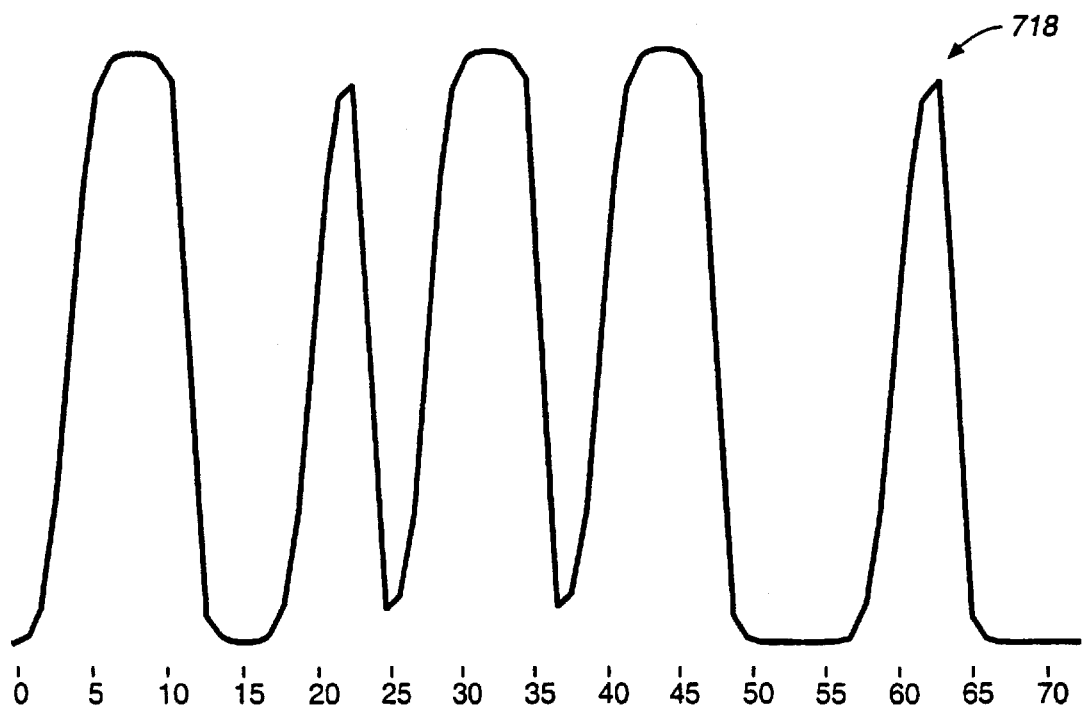
FIG._15C
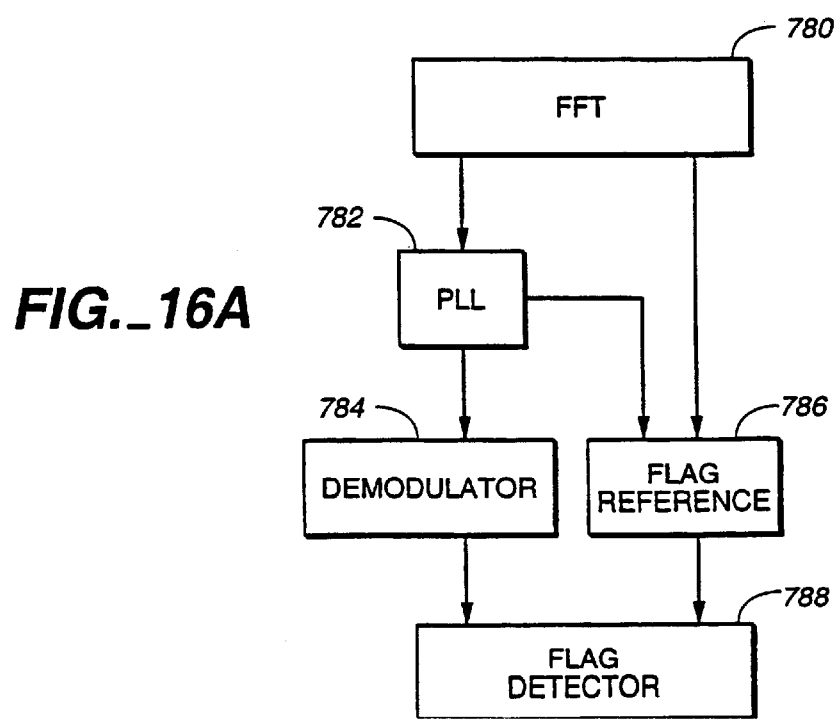
FIG._16A

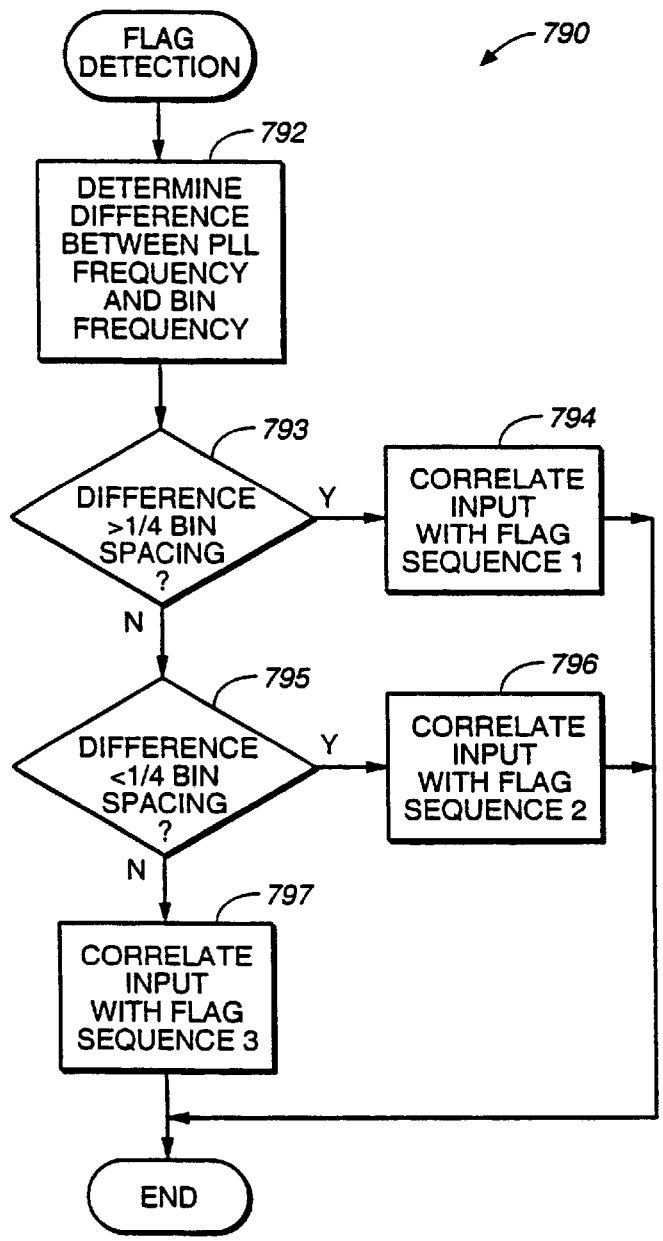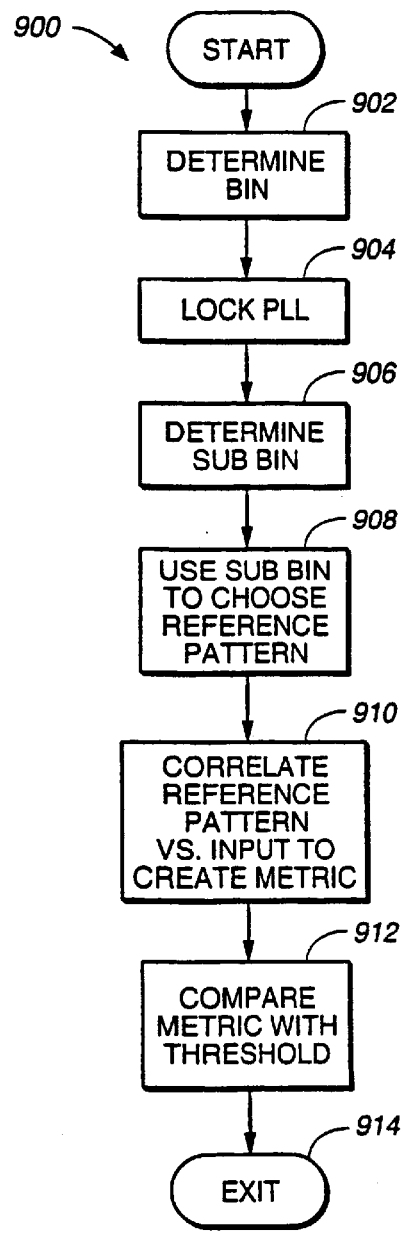
FIG._16B  FIG._16C

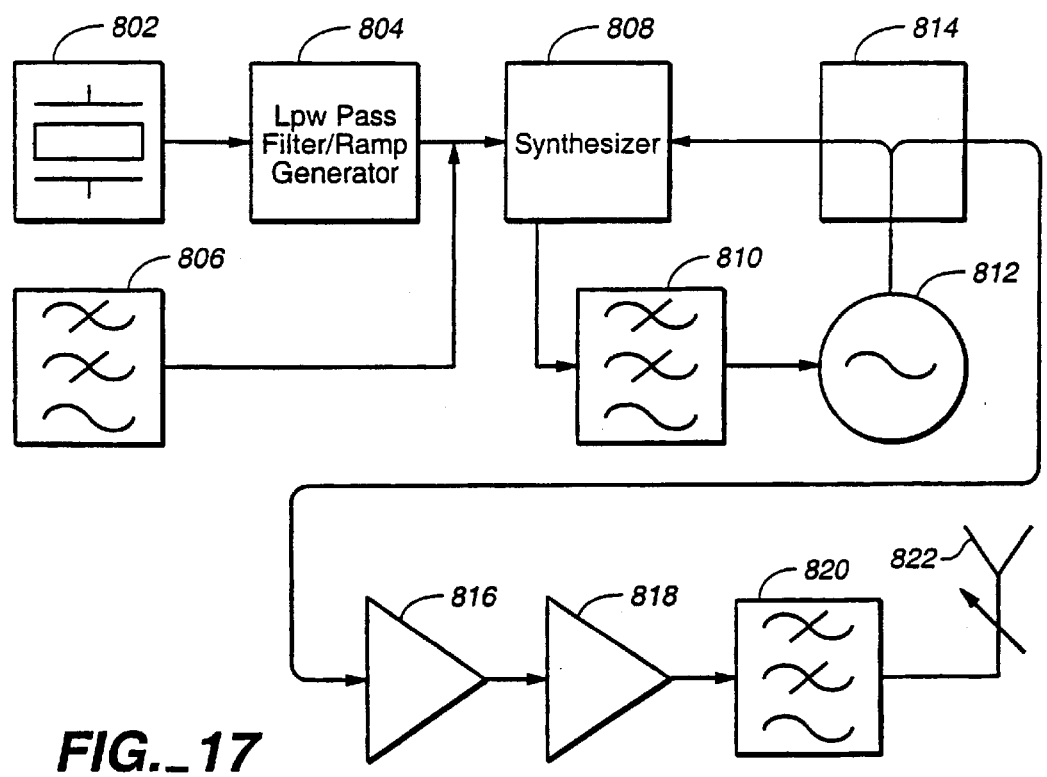
FIG._17
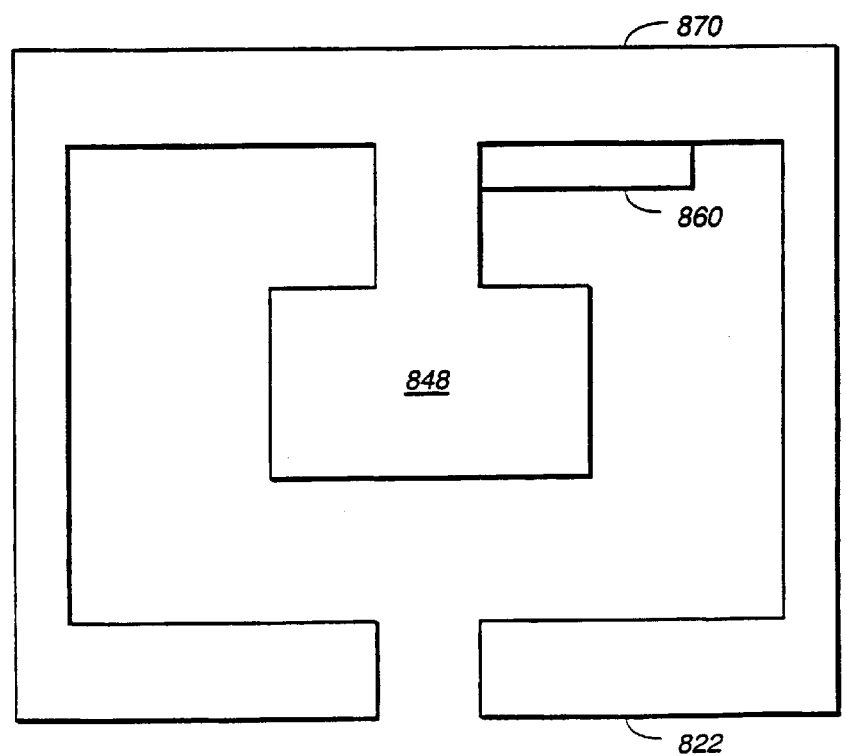
FIG 18

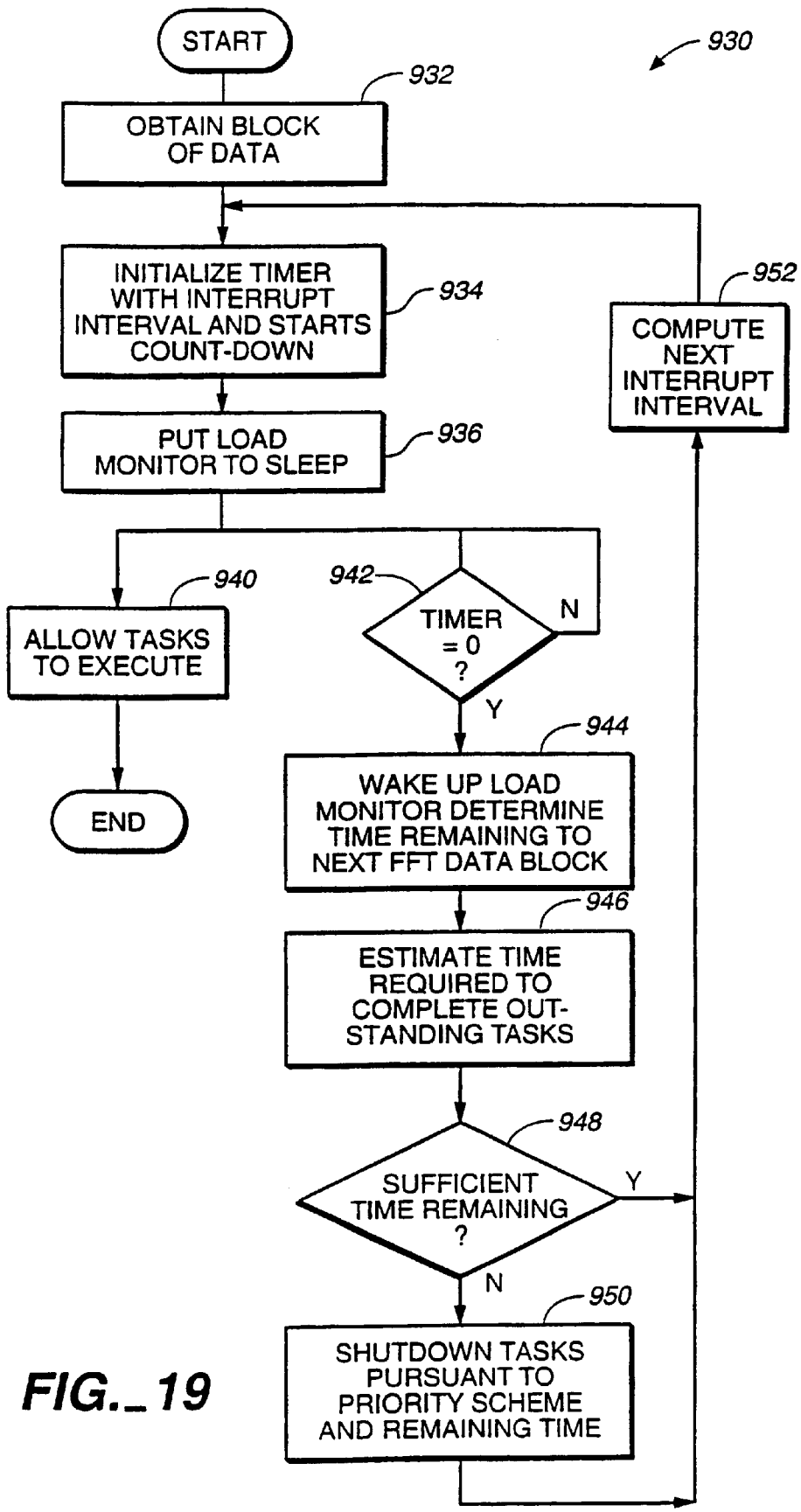
FIG._19

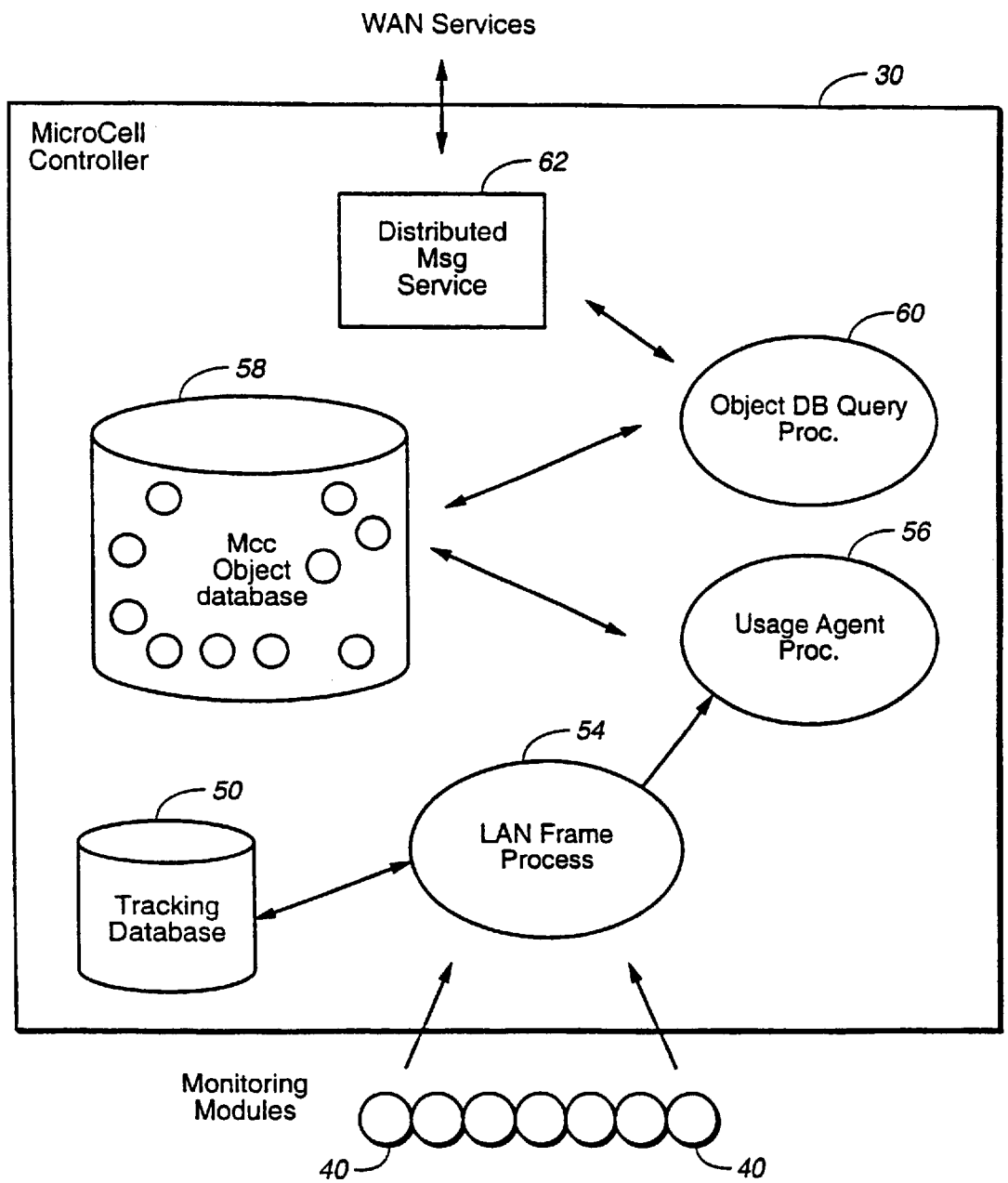
FIG._20

DETECTOR TOLERANT OF FREQUENCY MISALIGNMENT

BACKGROUND OF THE INVENTION

The present invention relates to a data transmission system, and more particularly to a data transmission system for utility metering.

The development and commercialization of various utility products, such as electricity, water, and gas have contributed to dramatic advances in living standards. In allocating usage bills, utility companies typically gauge consumption using meters and bill their customers accordingly. Traditionally, at the end of a reporting period, a utility employee physically inspects and records each customer's meter readout dials which reflect usage. The recorded data is eventually entered into an accounting system for billing purposes. This process is labor intensive and duplicative. Moreover, the meter reading process may be disrupted by unplanned nuisances such as dogs and inclement weather. Further, this process cannot provide time-of-day metering so that the utility company can charge for the utility product as a function of load factors.

To overcome these inefficiencies, remote meter reading systems have been developed which automatically capture consumption data from the field. In situations which cannot afford dedicated lines or connections to the plain old telephone service (POTS), wireless meter reading systems have been deployed. Typically, such a wireless meter reading system includes a base station which transmits on one frequency to a remote station, which in turn may relay the transmission to other remote stations. The base station also receives data from the remote stations on the same or related frequency. The wireless transmission of data between the base and remote stations is determined by the licensing rules of a government regulatory authority such as the Federal Communications Commission (FCC) in the United States or the Radio-Communications Authority (RA) in the United Kingdom (UK).

Generally, the authority grants licenses to operate radio transmitters that have to operate within a limited frequency spectrum. For instance, in the UK, a spectrum between 183.5 MHZ and 184.5 MHZ is reserved for metering applications. The band is in turn divided into eight 25 kHz channels and four 200 kHz channels. Similar frequency allocations are also enforced in various other countries which reserve a band of frequencies for various applications such as meter data collection.

Due to the limited frequency spectrum, data transmission needs to be within a narrow range such as within about 100 kHz of a predesignated transmission frequency. Since the wireless meter reading system deploys many more transmitters than receivers in forwarding usage statistics to a utility company's central location, each transmitter needs to be made as economically as possible. Typically, the most expensive component in the transmitter is a quartz crystal resonator which controls the transmission frequency.

The resonators use crystals made of quartz in the frequency generation process. Due to the cost of the crystal, it is desirable to use the least possible expensive grade of crystal. However, low grade crystals tend to be more sensitive to ambient and operating temperature variations. Further, over time, the frequency generated by low grade crystals tend to drift. As such, the use of low grade, inexpensive crystals tends to reduce the accuracy of the transmitter's operating frequency. Further, other components associated with the frequency generation process are also subject to aging. For instance, as capacitors age, variations in their capacitive values may cause a frequency variation in a ±10% range.

Thus, the use of inexpensive components may cause the transmission frequency to vary out of alignment during operation as the components heat up. Further, over time, the transmission frequency may drift out of alignment due to aging. If the frequency variations are significant, the components associated with the frequency generation process need to be replaced or aligned so that the base station and the remote stations can communicate with each other in the designated frequency range. Such replacement or alignment operations are cost prohibitive and for many applications, not practicable. Alternatively, higher grade, but more expensive crystals could be used.

SUMMARY

A method to separate data transmitted in parallel at arbitrary frequencies within a channel includes: separating a signal from one channel into a plurality of bins representing sub-channels, each bin having a bin frequency; generating a locked frequency by applying a phase locked loop (PLL) to each sub-channel; determining a difference between the locked frequency and the bin frequency; and correlating the signal with a difference between the locked frequency and the bin frequency.

Implementations of the invention may include one or more of the following. The bin may have a center frequency representation, wherein the signal is compared with the center frequency representation. Wherein the bin has a low frequency representation, the signal may be compared with the low frequency representation. Further, where the bin has a high frequency representation, the signal may be compared with the high frequency representation. Additionally, where the bin has a center frequency representation, a low frequency representation, and a high frequency representation, the invention can determine a difference between the locked frequency and the center frequency representation; and if the difference is less than a predetermined value, compare the signal with the center frequency representation. The invention can also compare the signal with the low frequency representation if the low frequency representation is greater than the locked frequency representation. The signal may be compared with the locked frequency representation if the low frequency representation is less than the locked frequency representation. The predetermined value may be approximately 0.5 of the bin spacing. The invention can recover the data from the correlated signal Advantages of the invention include one or more of the following. The meter data transmission system is reliable in the field and free of transmission variations induced by aging and temperature variations. Repeatability is enhanced as the system does not depend on component tolerance. The system requires virtually no calibration or alignment with respect to its operating frequency. The system is robust to minor frequency variations and requires less time and effort to manufacture as well as to install in the field. The system has a low power consumption. Certain additional functionality may be programmed using the system's processor and memory without requiring additional circuitry.

BRIEF DESCRIPTION OF THE DRAWINGS

FIG. 1 is a schematic diagram illustrating a physical network configuration of a meter data transmission system in accordance with the present invention.

FIG. 2 is a diagram illustrating a logical network configuration for the physical network of FIG. 1.

FIG. 3 is a block diagram of a receiver in accordance with the present invention.

FIG. 4 is a block diagram of the digital signal processors (DSPs) which execute software modules of the receiver of FIG. 3.

FIG. 5 is a block diagram of operations performed by a first DSP of FIG. 4.

FIG. 6 is a block diagram of operations performed by second and third DSPs of FIG. 4.

FIG. 7 is a block diagram illustrating a binary phase adjustment operation in a PLL.

FIG. 8 is a block diagram of a PLL loop filter.

FIG. 9 is a block diagram of a numerically controlled oscillator in a PLL.

FIG. 10 is a block diagram of a state machine for detecting and demodulating incoming signals.

FIG. 11 is a block diagram of a demodulator.

FIG. 12 is a block diagram of a message reconstructor.

FIG. 14 is a data flow diagram showing communications between the second and third DSPs.

FIGS. 15A–15C are charts illustrating various flag sequence representations.

FIG. 16A is a block diagram of a flag sequence detector.

FIG. 16B is a flow chart of a flag sequence detection process.

FIG. 16C is a flow chart illustrating a flag detection process.

FIG. 17 is a block diagram of a transmitter for a monitoring module in accordance with the present invention.

FIG. 18 is an antenna for the transmitter of FIG. 18.

FIG. 19 is a flow chart illustrating a process for monitoring loads on the processors of FIG. 4.

FIG. 20 is a diagram illustrating internal processing blocks in each microcell controller of FIG. 1.

DESCRIPTION

Figure 13:
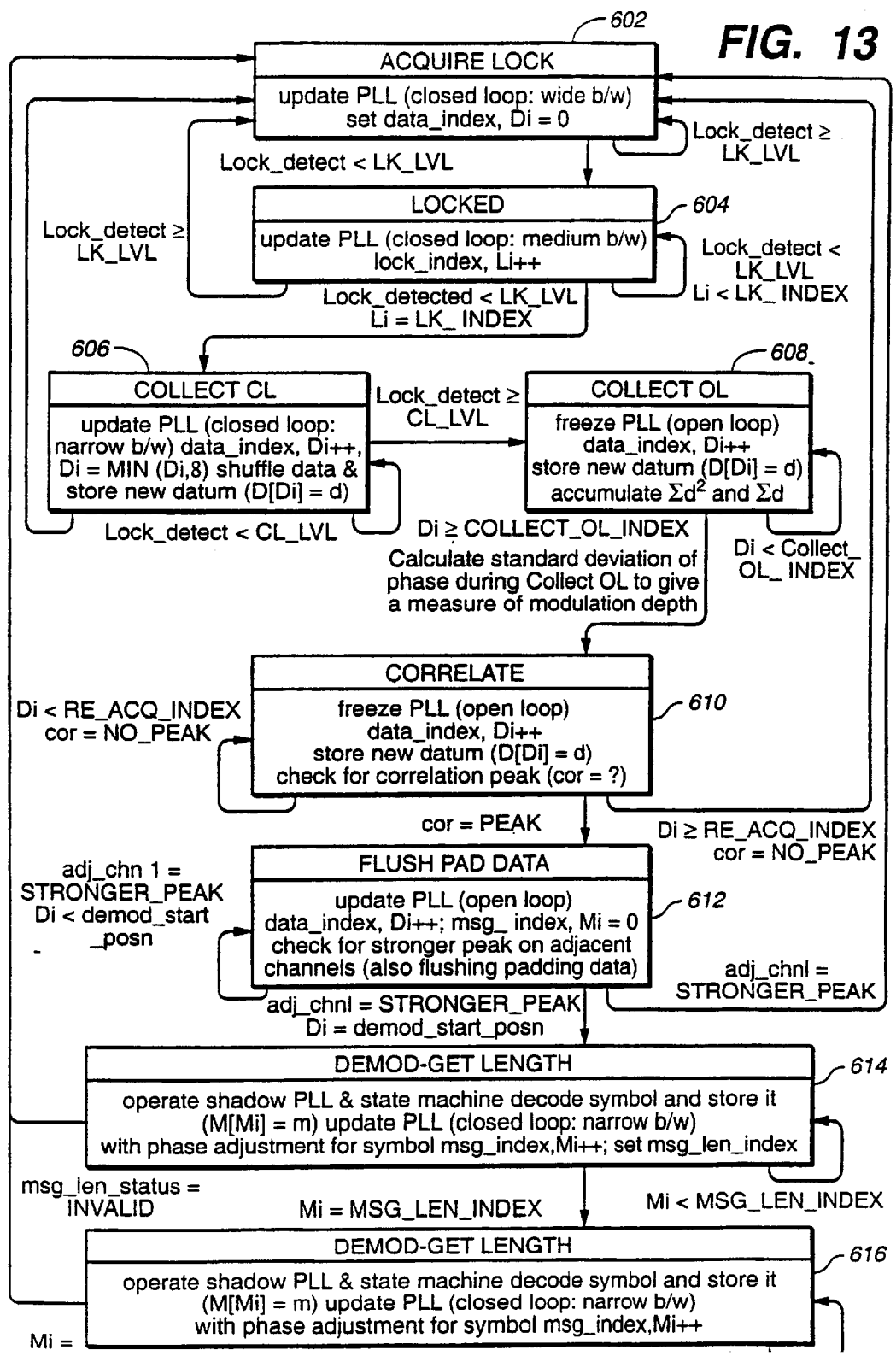
FIG. 13 is a Moore model of the state machine of FIG. 6.

FIG. 1 shows a data transmission system for disseminating utility usage information from points of use to a central database for processing. The transmission system is a wireless data network designed to provide telemetry services. The network uses a distributed processing and database approach to manage a high volume of data and large number of monitoring endpoints. Monitoring and communications services are configured according to specific needs of the customer.

As shown in FIGS. 1 and 2, each utility usage node 100 such as an electricity, gas or water meter, is connected to wireless telemetry monitoring module 40. Each module 40 collects usage information from its associated meter or end-point and wirelessly forwards that information over a transmission network, which ultimately reaches database 16 located at, for example, a central monitoring station. Monitoring module 40 may have a transmit-only capability, or may have both transmit and receive capabilities compatible with the rest of the system. Such two-way communications may support, for example, capabilities for receiving usage information and/or diagnostic information. The usage or consumption data transmitted in each transmission may also include redundant data previously transmitted to improve reliability so that the module transmissions can be used for advanced monitoring functions as described below.

The transmission network is generally configured as a series of wireless local area networks (LANs) 38 with inter-network communications supported by wide area network (WAN) 26. WAN 26 may be wireless or may be wired using land-lines. Typically, wireless telemetry monitoring module 40 communicate with a nearby LAN host called microcell controller (MCC) 30, 32, 34 or 36. The combination of monitoring modules 40 and MCCs 30–36 define LAN elements of the network. Each of MCC 30–36 has a well-defined group of monitoring modules to which is provided local area network services. Each of MCCs 30–36 requires WAN services in order to connect with system controller 20, where telemetry data is ultimately processed.

Within a complete transmission network, thousands of MCCs 30–36 will be managing the data transmitted from hundreds of thousands of monitoring modules. These MCCs 30–36 operate independently of each other and the system controller as autonomous network elements. But each MCC's object database is accessible by system controller 20 using WAN 26, as discussed below. The WAN may consist of any communication method which provides transport services for transmissions originating from either the system controller or the MCC. As such, WAN 26 in the network is simply a routed radio transmission transport service and does not perform any processing or operations on the transmissions themselves.

The WAN radio system may have one or more cell masters 22–24, each providing the transmission transport and routing services as required by MCCs 30–36 within their coverage area. Each of MCCs 30–36 is connected via cell master 22 to system controller 20. Message transmissions originating at system controller 20 and addressed to MCC 30–36 are immediately passed transparently through this connection. Similarly, transmissions originating at MCC 30–36 are passed to the system controller.

Turning now to FIG. 3, receiver 100 for the MCC is shown. The receiver detects and demodulates the meter transmissions from meter modules 40 and then passes received messages to a processor in the MCC. Through an RF front-end, data is converted from a continuous analog signal to a digitally sampled version. The RF front-end can include one or more of the following: down converter 104, local oscillator 106, summer 112, shaped noise source 114 and under sampling circuit 116. For diversity purposes, a second RF front-end is used, and the second front-end can include one or more of the following: down converter 110, summer 122, shaped noise source 124, under sampling circuit 126, and multiplexer 118.

Data is received periodically at random and on a random frequency within an allocated 100 KHz bandwidth, for example. A protocol deals with message collisions in time and frequency from meters that are in the same cell as well as in adjacent cells. Receiver 100 can receive in parallel data transmitted at arbitrary frequencies within a radio channel.

Receiver 100 captures radio frequency signals on two single-conversion down-converters 104 and 110, each being connected to antennas 102 and 108, respectively. The deployment of two down-converters 104 and 110 allows receiver 100 to operate with diversity and to enhance the reception of transmissions. Each of the single conversion down converters 104 and 110 is driven by low side local oscillator 106. The output of single conversion down converter 104 is provided to summer 112. Dithered or shaped noise 114 is also provided to summer 112. The output of summer 112 is provided to an under-sampling circuit 116 whose sampling frequency is set to the receiver's bit rate multiplied by 64 times the under sampling circuit's decimation rate. The under sampling frequency may be about 19 MHZ.

Correspondingly, the output of single conversion down converter 110 is provided to summer 122. The other input to summer 122 is dithered or shaped noise 124. The output of summer 122 is provided to an under-sampling circuit 126 whose sampling frequency is determined in the above-discussed manner for under-sampling circuit 116. The output of under-sampling circuits 116 and 126 are multiplexed through multiplexer 118. The multiplexed data is then decimated, interleaved in blocks and processed using a Fast Fourier Transform (FFT), as discussed below.

The output of multiplexer 118 in turn is provided to signal processing module 128 which performs mixing, filtering and decimating operations. The module 128 can be an Analog Devices part number AD6620, among others. The sampling is done before the filtering and decimating function. The use of passband sampling implements a pseudo mixing process. In one implementation, module 128 provides a continuous stream of about 111 complex kilo-samples per second which corresponds to 64 times over-sampling of the incoming data.

By this time, data has been converted from a continuous analog signal to a digitally sampled version. The conversion is completed by multiplying the continuous analog signal with a unit impulse train. To accurately produce the input waveform, the input signal's bandwidth to less than half of the sampling frequency.

The initial task of receiver 100 is to detect the presence of a transmission from module 40. As discussed above, certain countries reserve a band of frequencies for metering applications. The band is in turn divided into various channels. In order to make use of the narrow bandwidth of the signal transmissions, the total number of channels is split into a number of sub-channels, thereby matching the noise bandwidth in each sub-channel to the signal bandwidth. The channel division is done with a Fast Fourier Transform (FFT) which in effect, implements a fixed bank of filters, each with the response of the FFT window function. The sampled waveform is transformed from a time domain to a frequency domain using the FFT. The FFT of an impulse sequence in the time domain is an impulse sequence in the frequency domain with spacing equal to that of the sampling frequency.

Thus, the output of module 128 is provided to windowed-FFT block 130. Windowed-FFT block 130 performs a 128-point FFT which is executed at a rate of four times the bit rate to implement a bank of filters. The sampling rate is reduced by performing the FFT transform on the arrival of every 16 new samples, for example. Thus, the output of FFT block 130 results in 128 channels or streams of values representing the desired bank of bandpass filters whose centers are spaced by one half the bit rate. The data in the 100 KHz channel is carried in 114 channels. The remaining 14 channels represent transition band fall back regions caused by the final stage of decimation and are discarded. Further processing is performed only on the 114 sub-channels.

The output of FFT block 130 is provided to a bank of phase-locked loops (PLLs) and controller state machine 132. Flag detector 131 is connected to FFT block 130 and controller state machine 132 to detect and compensate for variations in the sub-channel center frequency. In combination, blocks 130, 131 and 132 detect the presence of a transmission in a sub-channel and allow the transmission to be recovered.

Each sub-channel of receiver 100 operates a similar process to capture a packet sent by module 40. A data packet includes the following fields:

preamble, which includes zero-phase data;
flag which includes flag-sequence data;
pad which includes padding data;
payload which is the data to be transmitted; and
trailer which includes trailer data.

The preamble, flag, and pad data are used to synchronize with the start of the payload.

In order to recover a phase modulation of the transmitted signal, which in this case is modulated using a constant-amplitude scheme or other techniques such as coherent modulation scheme, the frequency offset within a sub-channel bandwidth is removed and a PLL is used to track the signal. A dedicated PLL is provided for each of the sub-channels defined by the FFT output. Each PLL has its own loop filter and feedback which vary dynamically according to the stage of message reception in that subchannel. Further, the message structure has a constant carrier portion in the preamble to allow for initial block acquisition. The flag sequence then is used to acquire timing information and further to adjust the PLL parameters. Hence, frequency, phase, and timing information may be recovered before the message content is demodulated. A demodulated message has a text content and additional words for check bits and demodulation information. The message includes an average received signal strength indication (RSSI) measurement field, a channel number field, and status information. The text content including information such as usage and maintenance data is then recovered and suitably processed by a processor in the MCC.

After decoding the message, receiver 100 forwards or uploads the data in the message to the system controller for additional processing. Although in one embodiment, receiver 100 only receives transmissions from module 40, receiver 100 may also provide two-way communication with module 40 through an optional transmitter which downloads a variety of information such as a remote connect command, a prepayment command, a diagnostic request or a home management related request to module 40. In this case, module 40 includes a module receiver for receiving commands from the optional transmitter and appropriate circuitry to respond to the commands.

FIG. 4 is a block diagram of digital signal processors (DSPs) 202, 204, 206 and 208 which execute various signal processing software modules of receiver 100. DSPs 202, 204, 206 and 208 communicate over an internal high speed bus 209. For diagnostics or testing purposes, DSPs 202, 204, 206 and 208 can also communicate with a personal computer or host computer using a suitable interface such as a bidirectional serial interface.

During operation, DSP 202 receives sample data streams from the decimator in module 128 (FIG. 3). The data may be a dual channel stream of complex data values. The samples arrive in single synchronous serial blocks with real and imaginary values for each communication channel. DSP 202 has a serial port direct-memory-access (DMA) channel which is configured to transfer the real and imaginary values into a holding area in memory before generating an interrupt signal to DSP 202. An interrupt service routine executed by DSP 202 converts the real and imaginary values into floating point values and stores them in memory. When sufficient samples are received, the real and imaginary data are multiplied using a window function and processed through a 128 point complex FFT. In addition, an RSSI signal is generated for about one quarter of the FFT outputs after each FFT process.

DSPs 204 and 206 implement phase lock loops and state machines for two of the channels received by DSP 202. The RSSI and complex FFT values are transferred to DSPs 204 and 206 from DSP 202 under DMA control. Under a master DMA mode, when the FFT operation on a first channel A has been completed, an I/O circuit in DSP 202 is configured to use three of its external DMA channels to write real, imaginary, and magnitude values to an external DMA buffers of DSP 204.

DSP 208 performs error correction on the received message packets. It also performs diversity arbitration.

Turning now to FIG. 5, the processing operation performed by DSP 202 is shown in more detail. DSP 202 receives data which has been decimated and mixed from an analog to digital converter in a receiver front-end circuit. The RF front end converts a diversity RF signal to an intermediate frequency and to digitize the intermediate frequency. This data is provided to a window function block 302 which applies an f-point window to the incoming data. The output of block 302 is provided to an FFT size f block 304 which performs an f-point FFT on the data. The output of block 304 is provided to a subchannel block 306 which selects a predetermined set of center or middle p points. A spectrum analysis is performed on the output of block 306. The analysis is done on each of the p data samples received from the receiver front-end circuit. The data is provided to magnitude calculator block 308. The output of magnitude calculator block 308 is provided to moving average block 310 which generates a mean RSSI value. The output of block 308 are p-point complex spectrum as well as a p-point root-mean-square RSSI measure. The p-point complex spectrum and RSSI measure are passed to DSPs 204 and 206 for subsequent processing.

In FIG. 6, one channel with p-points of complex spectrum is provided to phase angle determination block 142 which calculates the phase angle of the channel signal. The output of phase angle determination block 142 is provided to summer 144. The output of phase angle determination block 142 is also used for shadow-PLL purposes. Summer 144 also receives an input from numerically controlled oscillator (NCO) 146. The output of summer 144 is provided to phase adjustment block 158 which in turn drives an absolute phase angle determination block 160 as well as loop filter 148. The output of loop filter 148 is provided to NCO 146. The output of absolute phase angle determination block 160 is also provided to moving average determination block 162 for determining a mean phase error. The phase values provided to block 162 may also be replaced by shadow phase values. Similarly, integrative values of loop filter 148 may be replaced by a shadow loop filter integrative value, and the NCO phase of NCO block 146 may be replaced by a shadow NCO phase.

The output of moving average determination block 162 is provided to threshold comparison block 164 to perform a lock detect. The output of output threshold block 164 is provided to finite state machine 166 which in turn drives phase adjustment block 158, loop filter 148, and switch 150. The output of switch 150 is provided to data detect block 152 and data demodulate block 154. The output of data detect block 152 in turn is provided to NCO block 146. Further, the output of datdemodulate block 154 is provided to message reconstruction block 156. The output of message reconstruction block 156 is provided to state machine 166. Message reconstruction block 156 then generates one or more demodulated messages as outputs.

In the bank of PLLs and controller state machine of FIG. 6, the input signal of the circuit is in Cartesian form which can be described in polar form as $Ae^{(J\ Q+W+N\pi)}$, wherein A is the amplitude or the transmission signal strength, Q is the phase due to the carrier, W is the phase due to a particular FFT bin, and N is the symbol identification. For instance, BPSK has two symbols that are separated by $\pi$. The circuit of FIG. 6 relies mainly on phase information since most of the necessary information may be expressed in terms of phase. Magnitude information has no role in locking signals, detecting flags or making bit decisions. The advantage of this approach is that only one value is required to represent phase information, while magnitude information, when expressed as Cartesian coordinates, requires two values. Computational resource requirement is minimized since only one memory access is required, and operations such as mixing require only one add operation rather than four multiply operations and two add operations.

Referring now to FIG. 7, the binary phase adjustment operation performed by block 158 of FIG. 6 is shown. Two inputs, a phase adjustment select signal and a locked signal with a phase offset, are used. First, a value n is assigned to zero to indicate that the phase is set to zero in block 402. Correspondingly, in block 404, n is assigned to a value of –1 to indicate that the phase is –$\pi$. The output of blocks 402 and 404 are provided to switch 406 which selects a phase adjustment according to the last demodulated symbol. The output of switch 406, –n$\pi$, is provided to summer 408. Summer 408 also receives an output from switch 410 which receives as its input a locked signal with a phase offset due to the modulated symbol. Switch 410 in turn is controlled by a signal carrying the channel state. A second output of switch 410 is also provided to one input of switch 412. The second input of switch 412 is connected to the output of summer 408. Switches 410 and 412 are both controlled by the current channel state. Thus, if flag DMOD_GET_LENGTH or flag DMOD_USE_LENGTH has been set, then switches 410 and 412 are set to adjust the phase of the symbol. Otherwise, switches 410 and 412 are set to leave the phase of the symbol as is. The output of switch 412 is a locked signal where the symbol phase offset has been corrected.

FIG. 8 shows a block diagram of loop filter 148. Loop filter 148 receives an estimate of a signal phase error generated by phase adjustment block 158. The estimate is provided to an amplifier 422 whose output is provided to summer 430. The estimate of the phase error is also provided to second amplifier 424, whose output is provided to summer 426. Amplifiers 422 and 424 are set according to the channel state. For instance, to freeze the phase lock loop, alpha and beta are set to zero.

Summer 426 also receives the output of hard limiter 434. The output of summer 426 in turn drives phase store module 428. The output of phase store module 428 is provided to unit time delay module 432 whose output is supplied to the hard limiter 434. The output of phase store module 428 is also provided to summer 430, whose output signals indicates that a modification needs to be made to a VC phase store.

Referring now to FIG. 9, a block diagram illustrating in more detail NCO 146 of FIG. 6 is shown. The input to NCO 146 is a phase change signal and a phase correction signal from loop filter 148 and data detect module 152, respectively. These two signals are provided to summer 434. Additionally, summer 434 receives a fixed phase operation block 432. The output of summer 434 in turn is provided to second summer 436. Summer 436 drives phase store module 438, which stores the phase information. The output of phase store module 438 is provided to unit time delay module 440 which in turn drives summer 436. The output of phase store module 438 is a phase corrected output which is then provided to summer 144.

Referring now to FIG. 10, a block diagram illustrating detector 152 of FIG. 6 is shown. Detector 152 receives data samples of a locked signal with zero phase and frequency error. The data is stored in a buffer 452 which shuffles data if the current state is COLLECT_CL. The output of data buffer 452 is provided to switch 454 which is controlled by the subchannel state. Switch 454 performs correlation if the current state is CORRELATE. The output of switch 454 is provided to complex correlation block 456 which selects a filter flag sequence to use based on the frequency, as the phase characteristic of the flag is affected by the carrier position within the subchannel. The output of complex correlation block 456 is provided to switch 458. Switch 458 in turn is controlled by a command to locate −2× the phase angle of a detected peak. The output of switch 458 in turn is provided to a −2× correlator phase angle block 460 whose output is the post correlation phase correction to NCO block 146.

Store data buffer 452 also receives data from data pointer store 462. Data pointer store 462 is also connected to switch 464. The output of switch 464 is provided to reset data pointer block 466 and an increment data pointer block 468. The output of blocks 466 and 468 in turn are provided to switch 470. The output of switch 470 is provided to unit time delay block 472 which drives data pointer store 462. Switches 464 and 470 in turn are controlled by the channel state. Thus, if the channel state is equal to the ACQUIRE_ LOCK state or COLLECT_OL state, the data pointer is reset.

Referring now to FIG. 11, a block diagram of a demodulator 154 is shown. The input to demodulator 154 is a locked signal having a zero phase and a zero frequency error from switch 150. The input is provided to switch 482 which is controlled by the current channel state. Switch 482 demodulates data if the data is on the symbol timing. The output of switch 482 is provided to decision boundary block 484. The output of block 484 is provided to a symbol determination block 486. Block 486 generates a feedback to the phase information used to encode a symbol so that the PLL can correct itself. The output of symbol determination block 486 is provided to symbol conversion block 488 which converts the symbol to data bit streams of zeros and ones. The output of block 488 is used to reconstruct the message from the demodulated bit stream which is provided to message reconstructor 156 (FIG. 6).

Message reconstructor 156 of FIG. 6 is shown in more detail FIG. 12. The input to message constructor 156 is a plurality of demodulated message bits. The message bits are provided to buffer 492. The output of buffer 492 is provided to switch 494, which sends the message forward if a message pointer in the channel state is equal to the message length. The output of switch 494 in turn is supplied to a message package construction block 496. The output of block 496 is a reconstructed message that may be sent to DSP 208 of FIG. 4. Buffer 492 also receives an output from message pointer store 498. If the message pointer is equal to a the message length, message pointer store 498 sets the channel state to DMOD2 and obtains the message length. Alternatively, if the message pointer equals message length then the channel state is set to ACQUIRE_LOCK. Message pointer store 498 in turn is provided to switch 500. The output of switch 500 is provided to message pointer reset block 504 and to message pointer increment block 502, respectively. The output of blocks 502 and 504 are provided to switch 506. The output of switch 506 in turn is provided to unit time delay module 510 whose output is provided to message pointer store 498. Switches 500 and 506 are controlled by the current channel state. Thus, the switches reset the data pointer on entry to the state DMOD. The output of message reconstructor 156 is provided to DSP 208 for performing various error checking before the content of the message is provided to the system controller.

Referring now to FIG. 13, a Moore model of state machine 166 is shown. State machine 166 has ACQUIRE_ LOCK state 602, LOCKED state 604, COLLECT_CL state 606, COLLECT_OL state 608, CORRELATE state 610, FLUSH_PAD_DATA state 612, DMOD_GET_LENGTH state 614, and DMOD_USE_LENGTH state 616. In ACQUIRED_LOCK state 602, state machine 166 updates the phase lock loop, sets the data index and data points to zero and stores the new data in an array. State machine 166 remains in ACQUIRE_LOCK state 602 as long as a phase lock error flag is greater than or equal to LK_LVL. If that the PLL error is less than LK_LVL, ACQUIRE_LOCK state 602 transitions to LOCKED state 604.

In LOCKED state 604, the PLLs are updated and a LOCK index is incremented. State machine 166 remains in LOCKED state 604 as long as an error flag (PLL_err) is less than LK_LVL and that the lock index is less than LK_INDEX. When PLL_err is greater than or equal to LK_LVL, LOCKED state 604 transitions to ACQUIRE_ LOCK state 602. Alternatively, if PLL_Err is less than LK_LVL and the lock index is equal to LK_INDEX, LOCKED state 604 transitions to COLLECT_CL state 606.

In state 606, state machine 166 updates the PLL, sets the data index to CL_INDEX minus 1, shuffles the data and stores the new data in an array. Finally, it sets a collection of index (COLLECT_OF_INDEX). State machine 166 remains in state 606 as long as the datum is less than CL_INDEX and PLL_Err is less than CL_LVL. Alternatively, when the current data index is greater than or equal to CL_INDEX, state machine 166 transitions from COLLECT_CL state 606 to ACQUIRE_LOCK state 602. Additionally, in the event that the data index is less than CL_INDEX and PLL_Err is greater than or equal to CL_LVL, state machine 166 transitions from COLLECT_ CL state 606 to COLLECT_OL state 608.

In COLLECT_OL state 608, state machine 166 freezes the PLL, increments the data index and stores the new datum in the array. As long as the data index is less than COLLECT_OF_INDEX, state machine remains in COLLECT_OL state 608. Alternatively, when the data index is greater than or equal to COLLECT_OF_INDEX, state machine 166 transitions to CORRELATE state 610. In state 610, the PLL is frozen and the data index is incremented. Additionally, new data is stored in the array and a correlation peak is checked. In the event that the data index is greater than or equal to RE_ACQ_INDEX and a peak is not detected, the state machine 166 transitions from COR- RELATE state 610 to ACQUIRE_LOCK state 602. If the data index is less than RE_ACQ_INDEX and no correlation peak is detected, state machine 166 remains in COR- RELATE state 610. Alternatively, when there is a correlation peak, state machine 166 transitions from CORRELATE state 610 to FLUSHED_PAD_DATA state 612.

In state 612, the PLL is updated and the data index is incremented. Further, the message index is cleared. FLUSH_PAD_DATA state 612 also checks for stronger peak on adjacent channels, and flushes the pattern data. When the adjacent channel has a stronger peak, FLUSH_ PAD_DATA state 612 transitions to ACQUIRE_LOCK state 602. State machine 166 remains in FLUSH_PAD_ DATA state 612 as long as the adjacent channel does not have a stronger peak and the data index is less than DMOD_ START_POSITION. Alternatively, when the adjacent channel has a stronger peak and the data index equals DMOD_

START_POSITION, FLUSH_PAD_DATA state 612 transitions to DMOD_GET_LENGTH state 614.

In state 614, the symbols are decoded and stored. Further, the PLL is updated with phase adjustments for the symbol and the method index incremented. Additionally, a message length index is set. In the event that the message length index is less than MSG_LEN_INDEX, state machine 166 remains in state 614. Further, in the event that the message length status is invalid, state machine 166 transitions from DMOD_GET_LENGTH state 614 to ACQUIRE_LOCK state 602. Additionally, when the message index equals MSG_LEN_INDEX, DMOD_GET_LENGTH state 614 transitions to DMOD_USE_LENGTH state 616.

In state 616, symbols are decoded and stored, and the PLL is updated with the phase adjustment for the symbol. Additionally, the message index is incremented. State machine 166 remains in DMOD_USE_LENGTH state 616 as long as the message index is less than MSG_LEN_INDEX. When the message index equals MSG_LEN_INDEX, state machine 166 transitions from DMOD_USER_LENGTH state 616 to ACQUIRE_LOCK state 602.

FIG. 14 is a data flow diagram illustrating communications between DSP 202 and DSP 204. Each of DSPs 202 and 204 provide process 652 and process 654, respectively, for receiving demodulated messages. Data from buffer 652 is provided to a serial port 0 (SPORT0) receive process 660. Process 660 configures the DMA channel during start-up and reconfigures the DMA channel after a complete data block has been received. The output from SPORT0 receive process 660 is provided to buffer A 662. In one implementation, buffer A 662 stores about 40 32-bit words of data.

The output of buffer A 662 is provided to an extract message process 664. The spectrum component of each message is then provided to store spectrum process 666 while the transmitted packet portion is provided to an error correct process 674. The store spectrum memory area contains the most recent spectra received from the DSPs handling the two channels. Store spectrum process writes values from the spectrum message and stores them directly in the relevant spectrum store, along with a channel identifier.

Turning now to process 654 operating on DSP 204, data is provided to a serial port 1 (SPORT 1) receive process 661. The output of process 661 is provided to buffer B 663. The output of buffer 663 is provided to an extract message process 665. A spectrum component of the message from the extract message process 665 is provided to store spectrum process 668 for storing a spectrum message, while a transmitted packet portion of the message extracted by process 665 is provided to an error correct process 676. The spectrum message contains information about the power in each of the used sub-channels. Store spectrum process 668 and error correct process 676 in turn provides a ready-to-send signal back to DSP 204. Similarly, store spectrum process 666 and error correct process 674 provide a ready-to-send signal to DSP 202.

The outputs of store spectrum processes 666 and 668 in turn are provided to spectrum store buffer 670. Correspondingly, corrected packets from error correct processes 674 and 676 are provided to channel message store buffer 678. Message store buffer 678 holds messages (already corrected) from DSPs in order to determine diversity arbitration.

The output from spectrum store buffer 670 and channel message store buffer 678 are provided to process 680 which arbitrates, adds message statistics, or provides the statistics and stores the message. Process 680 also receives noise floor information from process 672 as well as spectrum information from spectrum store buffer 670. They arbitrate, gather statistics and watchdog processes operate on the channel message store to ultimately generate messages to be sent to an I/O processor such as an 8051 microcontroller connected to the DSP 208.

Process 680 can be divided into a number of sub-processes: diversity arbitration, gather channel noise statistics, and watchdog to preceding DSPs. The diversity arbitration process attempts to pair messages on the following basis:

Paired messages must occur within 1 sample period of each other.

Paired messages will almost always occur in the same sub-channel on the diverse and main paths, although it is possible for a signal exactly half way between two sub-channels to appear on adjacent sub-channels for the two receivers; or The algorithm will chose the received signal with fewer errors.

The demodulated messages reported to the I/O processor should contain a measure of the channel noise. In addition, DSP 208 reports channel statistics to the I/O processor on a regular basis, even if DSPs 204 and 206 do not deliver any demodulated messages. This mechanism provides two features:

It enables the I/O processor to perform the watchdog function on DSP 208. The I/O processor should receive communications from DSP 208 on a regular basis.

It enables the I/O processor to determine whether any potential lack of received signals is due to the radio channel being jammed or perhaps due to the radio becoming deaf.

Since DSPs 204 and 206 report the RSSI across the used spectrum on a regular basis (regardless of the number of demodulated messages), DSP 208 may perform a watchdog function on the preceding devices. When spectra information is not reported by DSPs 204 and 206, DSP 208 may report the problem to the I/O processor so that the I/O processor can determine whether to instruct the DSP 208 to reset the whole cluster of DSPs.

The output from process 680 is provided to message layer buffer 682 which in turn is provided to data link process 684 for generating a new message. The new data link packet is in turn provided to a data link transmit and receive buffer 686 which may store in a single message. The output from data bank transmit/receive buffer 686 in turn is provided to data link process 688 which drives a serial port of DSP 690.

In receiver 100, the PLL is used for correlating and demodulating. Since the FFT window function specifies a fixed bank of filters, if the carrier is off to one side of a particular sub-channel, the correlation and demodulation processes are not centered on the carrier. This has two effects, both of which are accentuated by the over-filtering characteristic of the window function: 1) the signal is weaker than if centered in the channel; and 2) phase transitions 0 to 1 and 1 to 0 receive different amounts of attenuation.

These issues are resolved using flags and a flag detection process. The flag provides a known sequence of data which can be correlated against to obtain timing information about a packet.

FIGS. 15A–15C show three examples of the phase modulation at the filter output for a flag sequence input (the phase ramp due to frequency offset has been suppressed.) A first example is associated with waveform 710 (FIG. 15A), which is approximately at the center. A second example (FIG. 15B) is associated with waveform 716 which is about ¼ bandwidth to the left of the center frequency. Finally, a third example (FIG. 15C) is associated with waveform 718 which is about ¼ bandwidth to the right of the center.

As shown in FIGS. 15A–15C, for trajectories corresponding to 010 bit patterns, the phase does not reach 180°. Even for a 011 bit pattern, it is after two extra samples that the phase is at 180°. Where the carrier is at the lower frequency limit of the sub-channel, the rising phase edges are faster and the falling edges are slower compared to the center channel trace. This is because the rising edges correspond to an increase in the carrier frequency due to the modulation which moves the instantaneous carrier frequency into the center of the sub-channel where it receives reduced attenuation. Conversely, the falling edges correspond to reducing the carrier, causing increased attenuation. These artifacts can be attributed to the binning artifacts of the FFT operation, where it is possible to achieve almost 100 dB stop band attenuation. This occurs at the expense of flatness in the pass band and roll off.

As a result of the stop band attenuation, the pass band is heavily overfiltered, not at all matched to the approximately 1700 bps received signals. At the center of an FFT output, the response rolls off by a small amount. The roll-off becomes more significant at the center of the adjacent FFT output. As such, the FFT outputs have significant overlap. In order to prevent the PLL on adjacent FFT outputs locking to the signal, the PLL frequency has to be limited. Further, the sensitivity of the system is not uniform across a sub-channel—it is approximately 1 dB less if an incoming signal is at the edge of sub-channel compared to the center. Excessive filtering of the signal means that the carrier phase does not reach the destination constellation point within a bit period—there is thus inter-symbol interference. The effects of inter-symbol interference can be ameliorated. Finally, phase transitions receive differing amounts of attenuation depending upon their location within a sub-channel. To compensate for the over-filtering caused by the FFT block, a flag sequence detector may use more than one phase waveform representation, as discussed below.

A block diagram of data flow among software modules in receiver 110 for detecting flag sequences is shown in FIG. 16A. Data received by the receiver is processed by FFT block 780 (FFT block 130 of FIG. 3). The output of FFT block 780 is provided to bank of PLLs 782 (PLL bank 132 of FIG. 3) and flag reference block 786. The PLL acquires carrier lock on a series of alternate ones and zeros, so receiver 100 can then mix a packet signal to base-band and recover information.

Flag reference block 786 also receives an output from PLL banks 782. The output of PLL bank 782 is also provided to a demodulator 784. A flag detector 788 receives the outputs of both demodulator 784 and flag reference block 786, and generates a flag detector output to be used by state machine 132 (FIG. 3).

FIG. 16B shows a process 790 which generates a correlation response of the incoming signal against the appropriate flag sequence. First, the difference between the locked PLL frequency and the bin's frequency is computed (step 792). The difference is then tested to see if it is positive and greater than one-quarter of the bin frequency spacing (step 793). If the difference is greater than one-quarter of the bin frequency spacing, the inputs are correlated against the representation of the flag sequence of FIG. 15C (step 794).

Alternatively, if the difference is not positive and greater than one-quarter of the bin frequency spacing, the difference is then tested to see if it is negative and more than one-quarter of the bin frequency spacing (step 795). If the difference is negative and more than one-quarter of the bin frequency spacing, the inputs are correlated against the second representation of the flag sequence of FIG. 15B (step 796). Otherwise, the inputs are correlated against the third representation of the flag sequence of FIG. 15A (step 797). From steps 794, 796, or 797, the process 790 exits.

In this process, each field in a packet is provided to allow a receiver to obtain frequency and timing information for the packet, and to calculate the start position of a payload. The preamble provides a pure carrier (zero-phase modulation) for a receiver to lock to, and also helps to reduce false correlation peaks in the matched filter output. The pad provides a buffer-zone so that the receiver can identify a peak in the matched filter's output, and calculate, in advance, where the payload will start. It also helps to reduce false correlation peaks in the matched filter output. The trailer provides time for a transmitter to switch-off its power amplifier at the end of a packet without affecting any of the field containing information. The trailer contains dummy data, arbitrarily set to zeros.

A modified complex pseudo-random sequence is used for the flag, and its complex-conjugate is used for the matched filter coefficients. All pseudo-random sequences have an odd number of bits. The value of the bit is chosen so that the modified sequence will have an approximately equal number of ones and zeros.

False peaks are reduced without requiring the flag to be repeated. This is done by selecting a pseudo-random sequence for the flag such that: the front-end of the flag is similar to the post-flag data (i.e., the pad—all zeros) and the rear-end of the flag is similar to the pre-flag data (i.e., the preamble all zeros). For instance, a flag of 0X3D64 satisfies these criteria, since 1) it is a modified pseudo-random bit sequence: a maximal length pattern, generated by a 4 stage LFSR, with a zero added to it; 2) the front end of the flag 00 is similar to the pad data of four zeros; and 3) the rear-end of the flag 00100 is similar to the preamble data of all zeros.

The synchronization procedure, considered for one packet arriving on a single sub-channel of the receiver, has the following stages:

Acquire phase lock: the early part of the preamble allows a PLL to acquire carrier lock on a received signal (the time taken varies), so it can be mixed to base-band. Once lock is acquired, subsequent data samples are stored sequentially in a buffer.

Maintain phase lock: the next parts of the preamble are used to maintain and improve the lock of the PLL, which is then declared to be fully locked.

Correlate: the remainder of the preamble, all of the flag, and part of the pad data are correlated against each other, until a peak is identified. This requires matched filter output values to be calculated for data beyond the end of the flag. The position of the peak indicates the end of the flag sequence. By adding the length (in bits) of the pad data to this value, the position of the start of the payload can be calculated.

Flush pad data: the remainder of the pad data is discarded as it arrives at the receiver, while it waits for the payload to begin.

Referring now to FIG. 16C, a process 900 is shown for determining flag detection. First, the number of bins is determined (step 902). Next, the bin frequency is generated by locking the phase lock loop (step 904). In step 906, the frequencies associated with sub bins are determined. The sub bin frequencies are then used to select one or more reference patterns (step 908). Next, the correlation is performed between the reference pattern versus the incoming signal data to create a metric (step 910). The metric is then compared with a predetermined threshold (step 912). If the metric is above a predetermined threshold, then the flag sequence is confirmed. Otherwise, the process 900 skips the current cycle and waits for the next cycle to determine the flag sequence.

FIG. 17 shows a digital transmitter 800 located at the module 40 and which communicates with receiver 100. In transmitter 800, reference oscillator 802 provides an approximately square-wave signal to ramp generator/low-pass filter 804, which has an RC time constant about equal to the time duration of one data symbol. Low pass filter 804 reshapes the square-wave input to an approximately triangular-wave output which is applied to synthesizer 808. Synthesizer 808 also receives a signal from low-pass filter 806 which provides the over-sampled modulation signal. Synthesizer 808 contains reference divider, signal divider, and phase detector. The output of synthesizer 808 is provided to loop filter 810, which in turn controls sine-wave generator 812.

The modulation scheme used by transmitter 800 is phase modulation. This is generated by the reference divider within synthesizer 808 having a triggering threshold about equal to the mid-range value of the triangular-wave output of low-pass filter 804. The addition of the modulation signal from low-pass filter 806 with the triangular wave from filter 804 results in an up-or-down voltage shifting of the combined-triangular-wave-plus-modulation. This shifting causes a modulation of the time that the combined-triangular-wave-plus-modulation signal passes through the triggering threshold of the reference divider within synthesizer 808. The modulation of the time of the triggering-threshold crossing looks exactly the same to the synthesizer as phase modulation of reference oscillator 802.

In one embodiment, the modulation signal produces the equivalent of a +/−2.4 degree phase modulation of the reference oscillator, and the synthesizer controls oscillator 812 to a phase modulation of +/−180 degrees. The synthesizer loop response provides additional low-pass filtering of the modulation.

The output of generator 812 is provided to splitter 814. One output of splitter 814 is provided to synthesizer 808, while the other output of splitter 814 is provided to an amplifier 816. The output of amplifier 816 is provided second amplifier 818. The output of amplifier 816 is in turn provided to harmonic filter 820 through second amplifier 818. The output of harmonic filter 820 is then provided to an antenna 822.

Transmitter 800 generates data signals at a bit rate of approximately 1.75 kbit/sec using BPSK modulation. These signals occupy an effective bandwidth of about 3.5 kHz. Transmitter 800 transmits data at a random time and on a random frequency within the allocated 100 kHz bandwidth. A protocol deals with message collisions in time and frequency (from meters in the same and adjacent cells) such that a signal received at a base station might contain many messages which are unsynchronized in time and modulated on a range of random frequencies. When operating with the receiver discussed above, the system supports a plurality of simultaneous transmissions, assuming that the transmission start time is random and uniformly distributed. Further, the system is designed to allow the transmitter to operate over a 100 kHz band, without the requirement for accurate transmitter frequency tolerance. By finely sub-dividing the band at the receiver, a signal can be resolved at any point within the 100 kHz.

Allowance for transmitter frequency tolerance is made by factory configuration to set the transmit limits to a band centered in the receiver's passband. A margin allowed at each end of the passband gives provision for both temperature drift and ageing of the reference crystal. Since both temperature and ageing drift are randomly positive or negative, a population of meters will, over time and temperature, expand to cover the full passband.

Since the receiver has a continuous coverage in the frequency domain, greater flexibility is afforded in the choice of transmitter frequencies. Although the transmitter has a set of discrete channels on which it can transmit, these do not need to correspond with any set of frequencies at the receiver. This alleviates the need to align the transmitter reference crystal. A tight tolerance crystal is not required, since the +/−30 ppm variation in oscillator frequency can be compensated for at factory calibration by selecting a sub-set of the available channels which falls within the required band.

FIG. 18 shows the layout of antenna 822 of FIG. 17 in conjunction with the transmitter circuitry. Antenna 822 is implemented as a loop antenna 870 using copper traces around the perimeter of printed circuit board 848 and resonated with a capacitor. To provide a compact, integrated transmitter board, the transmit circuitry is placed at the center of loop antenna 870. This removes the need for a separate antenna and interconnect, and also makes use of the space within the antenna.

The copper trace of loop antenna 870 surrounds circuit traces 848 which support the components associated with the transmitter circuitry (FIG. 17). An impedance matching trace 860 is connected to circuit traces 840 and the trace of loop antenna 870. Impedance matching trace 860 matches the impedance of loop antenna 870 to the transmitter's output impedance and thus matches loop antenna 870 to the impedance of free space.

The implementation of loop antenna 870 is inexpensive in that it is provided directly on the printed circuit board, thus antenna 870 is easy to implement and has a low profile. Moreover, physical assembly is not required.

Referring back to receiver 100, it is digital and executes a number of complex, compute-intensive processes using one or more DSPs. The DSPs have to be managed, and the processes have to be prioritized to manage processing loads if processing resources become insufficient given the time remaining in a particular transmission cycle.

Turning now to FIG. 19, a process 930 is shown for managing loads on one of the signal processors. First, process 930 receives a block of FFT data (step 932). Next, the process initializes a timer with an interrupt interval and starts the counter of a load monitor on a countdown sequence (step 934). The process 930 then puts the load monitor to sleep (step 936).

The load monitor process uses successive interrupts. A timer is initially configured to cause an interrupt after a time corresponding to $$T_1 = (T_{average} - T_{shutdown}) \times P_1 T_{overhead}$$

where $T_{average}$ is the average number of cycles available for each sub-channel, $T_{shutdown}$ is the number of cycles to shut down the sub-channel if time runs out, $T_{overhead}$ is the number of cycles reserved as overhead for running the load monitor and $P_1$ is the total number of sub-channels processed. If the timer reaches zero before all $P_1$ subchannels are processed, an interrupt is generated. In the interrupt service routine, a calculation is performed to determine whether any usable cycles remain. Since a certain number of sub-channels have already been processed, no time needs to be allowed for shutting them down in the event of a load monitor cut-in. The timer is reconfigured with the following value:

$$T_2 = T_{shutdown} \times P_1 - P_{processed} - T_{overhead}$$

where $P_{processed}$ is the number of channels processed since the last load monitor timer interrupt (or since the start of processing if this is the first interrupt). If this value $T_2$ is greater than a predefined useful limit, the timer placed in a "sleep" mode and is "waked-up", or enabled by subsequent interrupts whose timing is set by the timer.

While the monitor is "sleeping", tasks are allowed to execute (step 940). Concurrently, process 930 determines whether the timer set in step 934 has reached zero (step 942). If not, process 930 loops back to step 942 to continue the countdown. Alternatively, once the timer reaches zero, process 930 wakes up the load monitor and determines the time remaining to the next FFT data block (step 944). Process 930 then estimates the time required to complete the outstanding tasks (step 946). If sufficient time remains, the process then computes the next interrupt interval (step 952) and loops back to step 934 to initialize the timer with the new countdown period and starts the countdown period once more. In step 948, if insufficient time remains to complete all tasks, process 930 then shuts down tasks pursuant to a priority scheme which is proportional to the remaining time until the next FFT data block arrival (step 950). From step 950, process 930 proceeds to step 952 to compute the next interrupt interval and loops back to step 934 to initialize the timer and to start the countdown process to the next interrupt.

In this manner, in the event that sufficient time exists to complete all tasks, these tasks execute to completion in step 940. Otherwise, tasks are removed based on their priority as well as based on the amount of time remaining until either all tasks have been executed or no more time remains. In this manner, process 930 ensures timely operation and optimal channel usage. Further, the process can cope with the mean peak loading such that the system as a whole has more than sufficient resources for a 100 kHz channel fully loaded with transmissions, provided that the start times of these transmissions are random with uniform distribution, as discussed below.

In one embodiment, the channel capacity is of the order of simultaneous messages. The maximum number of messages which can simultaneously fit across a 100 kHz band is about 28 if they happen to have ideal 4 sub-channel spacing. The implementation has sufficient resources to be simultaneously processing up to 40 messages provided they do not fall into the same state at the same time. However, certain situations may exist where there is insufficient resources for all channels to be processed. The maximum number of successful exactly coincident message detections that can be performed at any one sample time is around five. Even in a heavily loaded channel, the probability of three sub-channels simultaneously correlating successfully is small. However, this and similar situations will occur and thus a graceful means of terminating execution without overrunning the allocated time is defined.

This mechanism processes the sub-channels from the low frequency to the high frequency. As more sub-channels are processed, the time required to finish the remaining sub-channels is reduced. As processor resource is used, there may be insufficient cycles to do anything other than gracefully terminate the remaining sub-channels. Thus, all messages currently being received in these sub-channels are lost.

In heavy load situations, the situation will arise where only sufficient time remains to shut down all remaining sub-channels. In particular, if a strong signal arrives in a subchannel where a weak signal is currently being demodulated, it is desirable that the strong signal should terminate the processing of the weak signal (it will be corrupted anyway) and that the strong signal should then be recovered successfully. This is accomplished by the use of a shadow Phase Lock Loop and State Machine (PLLSM) for each of the 114 sub-channels. The impact on processing requirement is not excessive since a shadow PLLSM is dormant, requiring zero processor cycles, when the corresponding main state machine is not demodulating a signal (i.e., is idle or is detecting a signal).

The interaction of the main state machine and the shadow state machine are closely interrelated. The shadow state machine has the ability to abort the processing of the main state machine if it detects a packet arriving with RSSI 10 dB greater than the original message. In such cases, the main state machine takes over processing of the new message and the shadow PLLSM reverts to attempting to find another strong signal.

The partially received first message is not immediately discarded. It is passed on for cyclic redundancy checking (CRC) and, if necessary, for error correction. It may be that only the end of the message was lost through the subsequent stronger message. Since the error correction bits are placed at the end of the packet and are not required for a successful CRC, there is a possibility that the data content will remain intact.

Another situation which is catered for is that where a message is arriving just as the main PLL state machine is completing reception of a previous message. On demodulation of the final bit of the first message, the shadow parameters are copied across to the main PLL state machine, along with any stored phase, lock detect and modulation depth data. This enables the main PLL state machine to detect a new message which was just underway in the shadow PLLSM but had not progressed through to successful detection.

The operation of the system in collecting usage statistics and diagnostic data is discussed in FIG. 20. The transmissions from monitoring modules are received by any MCC located within receiving distance, which varies from time to time. Generally, the likelihood of a successful transmission from a monitoring module to an MCC is correlated with the distance between that module and that MCC.

Since only one MCC is required to serve a monitoring module, and since redundant MCC service of the monitoring modules is inefficient, the MCC is coordinated by the system controller to eliminate any redundancy that may occur in the effective coverage areas. This coordination is as follows: the first time an MCC receives a transmission from a specific monitoring module, that Tracking MCC begins to process the signals from the module in order to measure the effective signal strength and estimate the radio link reliability for that monitoring module. This generally takes less than four hours. After doing so, that tracking MCC transmits a signal to system controller including information identifying the newly discovered monitoring module (the meter network address), the determined signal strength (the average received signal level), and the reliability of transmissions (the transmission statistics) received by that Tracking MCC from that monitoring module.

The tracking MCC then takes over the management and processing of the data transmitted from the monitoring module. The data contained within a monitoring module transmission may be processed in several different ways depending on the level of service that has been required by the customer. The processing of the data by the tracking MCC may be conducted by agent processes 56 (FIG. 20), which are computer program modules operating within the tracking MCC, defined for each specific endpoint module type. These processes may receive the monitoring module's transmissions and may decode them to extract the appropriate data. With the extracted data, the agent process may compute an update to be saved in the tracking MCC local object database 58 of FIG. 20, representation of each of its assigned monitoring modules 40. As each subsequent transmission is received, the object database representation of the monitoring module may be updated by the agent process.

Each agent process may be defined by algorithms specific to the services provided for a module type. Utility monitoring modules are typically processed according to one of several possible service definitions:

1. Basic usage reading is typically defined to mean that at least one reading a day is provided where that reading generally represents the consumption data that is received just before midnight on a particular day. In this case, the usage module agent process will simply update the MCC object database with the most current total consumption value and status indicators each time a new transmission is received (typically over 100 transmissions per day). This agent process overwrites any earlier consumption data and at midnight captures and stores the most current values in a "snapshot buffer," which is subsequently retrieved by the system controller.

2. Load Profile service is defined as the processing of consumption data in order to create a profile of consumption based on specific measurement intervals. In this service, the agent process extracts the interval consumption data contained within the monitoring module 40 transmissions and aggregates the module interval data into specific Load Profile intervals. For example, a typical monitoring module might transmit 2.5 minute consumption interval data which is aggregated into 15 minute Load Profile intervals by the agent process of the MCC. The Load Profile interval data is saved in the MCC object database for retrieval by the system controller.

For each monitoring module, there may be at least basic meter reading data within the tracking MCC's database. In addition to this basic service any of the other services may be provided by that MCC in which case the appropriate data as described above may be accumulated within the MCC's object database. Shortly after midnight each day, the system controller may read this database to recover the "snapshot buffer" which is then provided to the system controller load profile databases.

The services described above relate to the processing of usage data contained within the regular and periodic transmissions emanating from the monitoring modules every few minutes. In addition to these regular metering services, the network can also provide certain "event handling" services that detect and process transmissions that contain data representing events that occurred at the monitoring module. An event record is created in the MCC object database to keep track of the events. For example, a power outage event triggers the transmission of a Loss-of-Communication message by the monitoring module 40. The transmission containing this message is identified by a specific message type so that the tracking MCC that receives the transmission will process it as an event. In the case of the Loss-of-Communication event, the MCC may record the total number of such events received from its monitoring modules and then create an event summary in the MCC object database, which is subsequently sent to the system controller indicating that a Loss-of-Communication has occurred.

Both the routine meter data processing and the event handling functions make use of the MCC's object database services which contain the monitoring module data attributes in a "meter object." Some of the attributes of the meter object may be:

1. Monitoring network address
2. Meter identifying number
3. Total measured usage
4. Total measured usage in TOU periods
5. Peak demand for each TOU period
6. Usage charge rate schedule (specifies TOU and demand algorithms)
7. Average received signal level
8. Transmission statistics
9. Event status fields and counters
10. Diagnostic and error status fields Thus, data from a specific monitoring module 40 transmission is decoded by only one MCC which is designated as the tracking MCC. Depending on the class of service (or rate scheduled) specified for that monitoring module, the data within the transmission is processed and saved in the MCC object database.

Since a monitoring module transmission is processed by a single MCC, the network processing resources are conserved. Similarly, since only one MCC stores a meter object for a specific monitoring module, the network's distributed database memory resources are conserved.

A virtue of a transparent WAN solution lies in the flexibility to substitute alternative WAN services and technologies when appropriate. The system controller manages the metering operations of each MCC by reading from and writing to the MCC object database 58 (FIG. 20). Usage data processing may be specified by writing to the specific rate schedule attribute of the object in the tracking MCC, while the usage information may be read as usage attributes for a number of monitoring modules 40 from the MCC's object database. These exchanges may be performed from the system controller using the specific query language developed for the distributed object database. These queries may be initiated at the system controller (client process) and passed to the MCC object database query process 60 using the distributed messaging services of the WAN.

In the case of a daily usage reading operation, the system controller may initiate a query to each MCC database 58 requesting all of the "snapshot buffer" usage data described earlier. This query may be performed separately for each class of service (basic and load profile). The query process in each MCC then accumulates the object data responsive to the specific query and compresses the data for efficient transmission to the system controller. The data contained within these query responses may be stored in the system controller database to account for meter usage. Each query and response may be conducted using the Distributed Messaging System (DMS) services which specifies the methods and protocols for transmission of data over the WAN portion of the network.

Alternatively, in the case of event reports, each of MCCs 30–36 may generate an event record, such as an event summary, in the MCC object database 58 which may cause the tracking MCC process to transmit a signal to the system controller providing data necessary for the system controller to create an event record in its database. This communication with the System controller database may also be conducted using the DMS services of the WAN 26.

The system controller thus requests and receives specific information from the MCC. Because the MCC processes and stores consumption data extracted from a transmission in an object database, the transmissions from the MCC to the system controller are significantly different from the transmissions from the monitoring modules to the MCC. First, since the monitoring modules transmit every few minutes, from which only the essential data is extracted and stored, the volume of data transmitted between the MCC and the system controller is much smaller, increasing the efficiency in the use of the WAN. Second, the processed form of data conveyed from the MCC reduces the processing required at the system controller making it possible to efficiently handle the hundreds of thousands or millions of utility monitoring modules on the network. Finally, event processing may be performed at the tracking MCC level which results in the transaction of event data without waiting for system polling processes.

Each of the above described signal processing modules can be implemented in a high level procedural or object-oriented programming language to operate in conjunction with a computer system with DSPs. However, the programs can be implemented in assembly or machine language, if desired. In any case, the language may be a compiled or interpreted language.

Each such computer program can be stored on a storage medium or device (e.g., CD-ROM, hard disk or magnetic diskette) that is readable by a general or special purpose programmable computer for configuring and operating the computer when the storage medium or device is read by the computer to perform the procedures described. The system also may be implemented as a computer-readable storage medium, configured with a computer program, where the storage medium so configured causes a computer to operate in a specific and predefined manner.

Although a wireless data transmission system has been disclosed for remote utility usage data collection, other suitable transmission techniques may be used as well, including optical or wireline transmission. Further, while the invention has been shown and described with reference to embodiments thereof, those skilled in the art will understand that the above and other changes in form and detail may be made without departing from the spirit and scope of the following claims.

What is claimed is:

1. A method to separate data transmitted in parallel at arbitrary frequencies within a channel, comprising:

separating a signal from one channel into a plurality of bins representing sub-channels, each bin having a bin frequency;

generating a locked frequency by applying a phase locked loop (PLL) to each sub-channel;

determining a difference between the locked frequency and the bin frequency; and correlating the signal with a difference between the locked frequency and the bin frequency.

2. The method of claim 1, wherein the bin has a center frequency representation, further comprising comparing the signal with the center frequency representation.

3. The method of claim 1, wherein the bin has a low frequency representation, further comprising comparing the signal with the low frequency representation.

4. The method of claim 1, wherein the bin has a high frequency representation, further comprising comparing the signal with the high frequency representation.

5. The method of claim 1, wherein the bin has a center frequency representation, a low frequency representation, and a high frequency representation, further comprising:

determining a difference between the locked frequency and the center frequency representation; and if the difference is less than a predetermined value, comparing the signal with the center frequency representation.

6. The method of claim 5, further comprising comparing the signal with the low frequency representation if the low frequency representation is greater than the locked frequency representation.

7. The method of claim 5, further comprising comparing the signal with the locked frequency representation if the low frequency representation is less than the locked frequency representation.

8. The method of claim 5, wherein the predetermined value is approximately 0.5 of the bin spacing.

9. The method of claim 1, further comprising recovering the data from the correlated signal.

* * * * *